(12) United States Patent
Dwiliński et al.

(10) Patent No.: US 7,744,697 B2
(45) Date of Patent: *Jun. 29, 2010

(54) BULK MONOCRYSTALLINE GALLIUM NITRIDE

(75) Inventors: Robert Tomasz Dwiliński, Warsaw (PL); Roman Marek Doradziński, Warsaw (PL); Jerzy Garczyński, Lomianki (PL); Leszek Piotr Sierzputowski, Union, NJ (US); Yasuo Kanbara, Anan (JP)

(73) Assignees: Nichia Corporation, Anan-Shi (JP); Ammono SP. Z O.O., Warsaw (PL)

( * ) Notice: Subject to any disclaimer, the term of this patent is extended or adjusted under 35 U.S.C. 154(b) by 0 days.

This patent is subject to a terminal disclaimer.

(21) Appl. No.: 10/682,891

(22) Filed: Oct. 14, 2003

(65) Prior Publication Data
US 2004/0089221 A1    May 13, 2004

Related U.S. Application Data

(62) Division of application No. 10/147,318, filed on May 17, 2002, now Pat. No. 6,656,615.

(30) Foreign Application Priority Data

Jun. 6, 2001    (PL) ...................................... 347918
Oct. 26, 2001    (PL) ...................................... 350375

(51) Int. Cl.
*C30B 9/02*    (2006.01)
(52) U.S. Cl. .................. 117/200; 117/205; 117/206
(58) Field of Classification Search ................ 117/200, 117/205, 206
See application file for complete search history.

(56) References Cited

U.S. PATENT DOCUMENTS

| 5,096,860 A | 3/1992 | Nadkarni |
| 5,147,623 A | 9/1992 | Eun et al. |
| 5,190,738 A | 3/1993 | Parent |
| 5,306,662 A | 4/1994 | Nakamura et al. |
| 5,456,204 A | 10/1995 | Dimitrov et al. |
| 5,589,153 A | 12/1996 | Garces et al. |
| 5,679,965 A | 10/1997 | Schetzina |
| 5,780,876 A | 7/1998 | Hata |
| 5,868,837 A | 2/1999 | DiSalvo et al. |

(Continued)

FOREIGN PATENT DOCUMENTS

CN    1036414 A    10/1989

(Continued)

OTHER PUBLICATIONS

M. Palczewska et al. "Paramagnetic Defects in GaN" MRS Internet Journal Nitride Semiconductor Res., 1998, pp. 1-3, vol. 3, No. 45, The Materials Research Society.

(Continued)

*Primary Examiner*—Robert M Kunemund
(74) *Attorney, Agent, or Firm*—Smith Patent Office

(57) ABSTRACT

The present invention refers to an ammonobasic method for preparing a gallium-containing nitride crystal, in which gallium-containing feedstock is crystallized on at least one crystallization seed in the presence of an alkali metal-containing component in a supercritical nitrogen-containing solvent. The method can provide monocrystalline gallium-containing nitride crystals having a very high quality.

14 Claims, 8 Drawing Sheets

U.S. PATENT DOCUMENTS

| | | | |
|---|---|---|---|
| 5,928,421 A | 7/1999 | Yuri et al. | |
| 6,031,858 A | 2/2000 | Hatakoshi et al. | |
| 6,046,464 A | 4/2000 | Schetzina | |
| 6,051,145 A * | 4/2000 | Griffith et al. | 210/761 |
| 6,067,310 A | 5/2000 | Hashimoto et al. | |
| 6,139,628 A | 10/2000 | Yuri et al. | |
| 6,153,010 A | 11/2000 | Kiyoku et al. | |
| 6,156,581 A | 12/2000 | Vaudo et al. | |
| 6,172,382 B1 | 1/2001 | Nagahama et al. | |
| 6,177,057 B1 | 1/2001 | Purdy | |
| 6,177,292 B1 | 1/2001 | Hong et al. | |
| 6,248,607 B1 | 6/2001 | Tsutsui | |
| 6,249,534 B1 | 6/2001 | Itoh et al. | |
| 6,252,261 B1 | 6/2001 | Usui et al. | |
| 6,258,617 B1 | 7/2001 | Nitta et al. | |
| 6,265,322 B1 | 7/2001 | Anselm et al. | |
| 6,270,569 B1 | 8/2001 | Shibata et al. | |
| 6,303,403 B1 | 10/2001 | Sato et al. | |
| 6,329,215 B1 | 12/2001 | Porowski et al. | |
| 6,355,497 B1 | 3/2002 | Romano et al. | |
| 6,372,041 B1 | 4/2002 | Cho et al. | |
| 6,399,500 B1 | 6/2002 | Porowski et al. | |
| 6,399,966 B1 | 6/2002 | Tsuda et al. | |
| 6,423,984 B1 | 7/2002 | Kato et al. | |
| 6,447,604 B1 | 9/2002 | Flynn et al. | |
| 6,459,712 B2 | 10/2002 | Tanaka et al. | |
| 6,468,882 B2 | 10/2002 | Motoki et al. | |
| 6,475,277 B1 | 11/2002 | Ryu et al. | |
| 6,488,767 B1 | 12/2002 | Xu et al. | |
| 6,509,651 B1 | 1/2003 | Matsubara et al. | |
| 6,531,072 B1 | 3/2003 | Suda et al. | |
| 6,534,795 B2 | 3/2003 | Hori et al. | |
| 6,586,762 B2 | 7/2003 | Kozaki | |
| 6,592,663 B1 | 7/2003 | Sarayama et al. | |
| 6,593,589 B1 | 7/2003 | Osinski et al. | |
| 6,596,079 B1 | 7/2003 | Vaudo et al. | |
| 6,614,824 B2 | 9/2003 | Tsuda et al. | |
| 6,627,552 B1 | 9/2003 | Nishio et al. | |
| 6,639,925 B2 | 10/2003 | Niwa et al. | |
| 6,653,663 B2 | 11/2003 | Ishida | |
| 6,656,615 B2 | 12/2003 | Dwilinksi et al. | |
| 6,677,619 B1 | 1/2004 | Nagahama et al. | |
| 6,686,608 B1 | 2/2004 | Takahira | |
| 6,693,935 B2 | 2/2004 | Tojo et al. | |
| 6,711,191 B1 | 3/2004 | Kozaki et al. | |
| 6,720,586 B1 | 4/2004 | Kidoguchi et al. | |
| 6,749,819 B2 | 6/2004 | Otsuka et al. | |
| 6,858,882 B2 | 2/2005 | Tsuda et al. | |
| 6,924,512 B2 | 8/2005 | Tsuda et al. | |
| 7,053,413 B2 | 5/2006 | D'Evelyn et al. | |
| 7,057,211 B2 | 6/2006 | Dwilinski et al. | |
| 7,081,162 B2 | 7/2006 | Dwilinski et al. | |
| 7,097,707 B2 | 8/2006 | Xu | |
| 7,132,730 B2 | 11/2006 | Dwilinski et al. | |
| 7,160,388 B2 | 1/2007 | Dwiliński et al. | |
| 7,252,712 B2 | 8/2007 | Dwilinski et al. | |
| 7,291,544 B2 | 11/2007 | D'Evelyn et al. | |
| 7,314,517 B2 | 1/2008 | Dwilinski et al. | |
| 7,315,599 B1 | 1/2008 | Morriss | |
| 7,335,262 B2 | 2/2008 | Dwilinski et al. | |
| 7,364,619 B2 | 4/2008 | Dwilinski et al. | |
| 7,374,615 B2 | 5/2008 | Dwilinski et al. | |
| 7,387,677 B2 | 6/2008 | Dwilinski et al. | |
| 7,410,539 B2 | 8/2008 | Dwilinski et al. | |
| 7,420,261 B2 | 9/2008 | Dwilinski et al. | |
| 7,422,633 B2 | 9/2008 | Dwilinski et al. | |
| 2001/0008656 A1 | 7/2001 | Tischler et al. | |
| 2001/0015437 A1 | 8/2001 | Ishii et al. | |
| 2001/0022154 A1 | 9/2001 | Cho et al. | |
| 2001/0030328 A1 | 10/2001 | Ishida | |
| 2002/0011599 A1 | 1/2002 | Motoki et al. | |
| 2002/0014631 A1 | 2/2002 | Iwata et al. | |
| 2002/0028564 A1 | 3/2002 | Motoki et al. | |
| 2002/0031153 A1 | 3/2002 | Niwa et al. | |
| 2002/0047113 A1 | 4/2002 | Ohno et al. | |
| 2002/0063258 A1 | 5/2002 | Motoki | |
| 2002/0078881 A1 | 6/2002 | Cuomo et al. | |
| 2002/0189531 A1 | 12/2002 | Dwilinski et al. | |
| 2002/0192507 A1 | 12/2002 | Dwilinski et al. | |
| 2003/0001238 A1 | 1/2003 | Ban | |
| 2003/0003770 A1 | 1/2003 | Morita et al. | |
| 2003/0022028 A1 | 1/2003 | Koike et al. | |
| 2003/0143771 A1 | 7/2003 | Kidoguchi et al. | |
| 2003/0209191 A1 | 11/2003 | Purdy | |
| 2004/0003495 A1 | 1/2004 | Xu | |
| 2004/0031978 A1 | 2/2004 | D'Evelyn et al. | |
| 2004/0089221 A1 | 5/2004 | Dwilinski et al. | |
| 2004/0139912 A1 | 7/2004 | Dwilinski et al. | |
| 2004/0238810 A1 | 12/2004 | Dwilinski et al. | |
| 2004/0244680 A1 | 12/2004 | Dwilinski et al. | |
| 2004/0251471 A1 | 12/2004 | Dwilinski et al. | |
| 2004/0255840 A1 | 12/2004 | Dwilinski et al. | |
| 2004/0261692 A1 | 12/2004 | Dwilinski et al. | |
| 2005/0087124 A1 | 4/2005 | Dwilinski et al. | |
| 2005/0249255 A1 | 11/2005 | Dwilinski et al. | |
| 2006/0032428 A1 | 2/2006 | Dwilinski et al. | |
| 2006/0037530 A1 | 2/2006 | Dwilinski et al. | |
| 2006/0054075 A1 | 3/2006 | Dwilinski et al. | |
| 2006/0054076 A1 | 3/2006 | Dwilinski et al. | |
| 2006/0057749 A1 | 3/2006 | Dwilinski et al. | |
| 2006/0124051 A1 | 6/2006 | Yoshioka et al. | |
| 2006/0138431 A1 | 6/2006 | Dwilinski et al. | |
| 2008/0050855 A1 | 2/2008 | Dwilinski et al. | |
| 2008/0108162 A1 | 5/2008 | Dwilinski et al. | |
| 2008/0156254 A1 | 7/2008 | Dwilinski et al. | |

FOREIGN PATENT DOCUMENTS

| | | |
|---|---|---|
| CN | 1036414 B1 | 10/1989 |
| CN | 1289867 A | 4/2001 |
| CN | 1065287 | 5/2001 |
| CN | 1260409 A | 6/2006 |
| EP | 0 716 457 A | 6/1996 |
| EP | 0 711 853 B | 9/1999 |
| EP | 0 949 731 A | 10/1999 |
| EP | 0 973 207 A | 1/2000 |
| EP | 1 088 914 A | 4/2001 |
| EP | 1164210 A2 | 12/2001 |
| EP | 1405936 A1 | 4/2004 |
| EP | 1616981 A1 | 1/2006 |
| FR | 2 796 657 A | 1/2001 |
| GB | 2 326 160 A | 12/1998 |
| GB | 2 333 521 A | 7/1999 |
| JP | 5141686 A1 | 4/1976 |
| JP | 60065798 A | 4/1985 |
| JP | 2-137287 A | 5/1990 |
| JP | 02137287 A1 | 5/1990 |
| JP | 5183189 A | 7/1993 |
| JP | 7-22692 B | 3/1995 |
| JP | 7-165498 A | 6/1995 |
| JP | 7-249830 A | 9/1995 |
| JP | 8-250802 A | 9/1996 |
| JP | 9-134878 A | 5/1997 |
| JP | 9-293897 A | 11/1997 |
| JP | 10-7496 A | 1/1998 |
| JP | 10-70079 A | 3/1998 |
| JP | 10-70338 A | 3/1998 |
| JP | 11-54847 A | 2/1999 |
| JP | 11-340573 A | 10/1999 |
| JP | 11-307813 A | 11/1999 |
| JP | 2000-82863 A | 3/2000 |
| JP | 2000-82867 A | 3/2000 |
| JP | 2000-216494 A | 8/2000 |
| JP | 2000-327495 A | 11/2000 |

| | | | |
|---|---|---|---|
| JP | 2001-85737 A | 3/2001 | |
| JP | 2001-148510 A | 5/2001 | |
| JP | 2001-247399 A | 9/2001 | |
| JP | 2001-342100 A | 12/2001 | |
| JP | 200226442 A1 | 1/2002 | |
| JP | 2002-241112 A | 8/2002 | |
| JP | 2002-274997 A | 9/2002 | |
| JP | 2003-40699 A | 2/2003 | |
| JP | 2004-168656 A | 6/2004 | |
| PL | 347918 A | 12/2002 | |
| PL | 350375 A | 5/2003 | |
| WO | 9428204 A1 | 12/1994 | |
| WO | 9713891 A1 | 4/1997 | |
| WO | WO 98/55671 A | 12/1998 | |
| WO | WO 01/24284 A | 4/2001 | |
| WO | WO 01/24921 A | 4/2001 | |
| WO | 01068955 A1 | 12/2001 | |
| WO | 02101124 A1 | 12/2002 | |
| WO | WO 02/101120 A | 12/2002 | |
| WO | 03035945 A1 | 5/2003 | |
| WO | 03043150 A1 | 5/2003 | |
| WO | 2004/090202 A1 | 10/2004 | |

OTHER PUBLICATIONS

O. Oda et al., "GaN Bulk Substrates for GaN Based LEDs and LDs", Physica Status Solidi (a) Applied Research, Mar. 6, 2000, pp. 51-58, vol. 180, No. 1.

I. Grzegory, "High Pressure Growth of Bulk GaN from Solutions in Gallium", Journal of Physics Condensed Matter, Jul. 26, 2001, pp. 6875-6892, vol. 13, No. 32, Institute of Physics Publishing.

K. Pakula, et al. "Growth of GaN Metalorganic Chemical Vapor Deposition Layers on GaN Single Crystals", Acta Physica Polonica A, 1995, pp. 861-864, vol. 88, No. 5.

R. Dwiliński et al., "On GaN Crystallization by Ammonothermal Method", Acta Physica Polonica A, 1996, pp. 763-766, vol. 90, No. 4.

A. Kuramata et al., "Substrate for III-V Group Nitride Semiconductors", Oyo Buturi, 1996, pp. 936-940, vol. 65, No. 9, Japan.

R. Dwiliński et al., "Exciton Photo-Luminescence of GaN Bulk Crystals Grown by the Ammono Method", Materials Science & Engineering B, 1997, pp. 46-49, vol. 50, No. 1-3, Elsevier Science S.A.

C.M. Balkas et al., "Growth of Bulk AlN and GaN Single Crystals by Sublimation", Mat. Res. Soc. Symp. Proc., vol. 449, 1997, pp. 41-46, Materials Research Society.

R. Dwiliński et al., "Ammono Method of GaN and AlN Production", Diamond and Related Materials, 1998, pp. 1348-1350, vol. 7, Elsevier Science S.A.

H. Yamane et al., "Polarity of GaN Single Crystals Prepared With Na Flux", Japanese Journal of Applied Physics, Jun. 1998, pp. 3436-3440, vol. 37, No. 6A, Publication Office Japanese Journal of Applied Physics, Tokyo, Japan.

R. Dwiliński et al., "Ammono Method of BN, AlN and GaN Synthesis and Crystal and Crystal Growth", MRS Internet Journal Nitride Semiconductor Research, 1998, pp. 1-4, vol. 3, No. 25, Retrieved from the Internet: URL:http://nsr.mij.mrs.org/3/25.

Y. Melnik et al., "Properties of Free-Standing GaN Bulk Crystals Grown by HVPE", Mat. Res. Soc. Symp. Proc., vol. 482, 1998, pp. 269-274, Materials Research Society.

S. Porowski, "Bulk and Homoepitaxial GaN-Growth and Characterisation", Journal of Crystal Growth 189/190, 1998, pp. 153-158, Elsevier Science B.V.

M. Yano et al., "Control of Nucleation Site and Growth Orientation of Bulk GaN Crystals", Japanese Journal of Applied Physics, Oct. 1999, pp. L1121-L1123, vol. 38, No. 10A, Part 2, Publication Office Japanese Journal of Applied Physics, Tokyo, Japan.

M. Aoki et al., "Growth of GaN Single Crystals From a Na-Ga Metal at 750° C and 5MPa of $N_2$", Journal of Crystal Growth, Sep. 2000, pp. 7-12, vol. 218, No. 1, North-Holland Publishing Co., Amsterdam, NL.

Douglas R. Ketchum et al., "Crystal Growth of Gllium Nitride in Supercritical Ammonia", Journal of Crystal Growth, 2001, pp. 431-434, vol. 222, Elsevier Science B.V.

Chu, T. L. et al., "Crystal Growth and Characterization of Gallium Nitride", Jan. 1974, pp. 159-162, J. Electrochem. Soc., Solid-State Science and Technology, vol. 121, No. 1.

Akasaki, I. et al., "Growth and Properties of Single Crystalline GaN Films by Hydride Vapor Phase Epitaxy", 1991, pp. 154-157, Crystal Properties and Preparation, vol. 32-34, Trans Tech Publications, Switzerland.

Kuroda, N. et al., "Precise Control of PN-Junction Profiles for GaN-Based LD Structures Using GaN Substrates with Low Dislocation Densities", 1998, pp. 551-555, Journal of Crystal Growth, vol. 189-190, Elsevier Science B. V.

Kim, S. T. et al., "Preparation and Properties of Free-Standing HVPE Grown GaN Substrates", 1998, pp. 37-42, Journal of Crystal Growth, vol. 194, Elsevier Science B. V.

Kaschner, A. et al., "Influence of Doping on The Lattice Dynamics of Gallium Nitride", 1999, 6 pages, MRS Internet J. Nitride Semicond. Res., No. 4S1, G3.57.

Motoki, K. et al., "Preparation of Large Freestanding GaN Substrates by Hydride Vapor Phase Epitaxy", Jpn. J. Appl. Phys., Feb. 2001, pp. L140-L143, Part 2, No. 2B, The Japan Society of Applied Physics.

S. Hirano et al. "Hydrothermal Synthesis of Gallium Orthophosphate Crystals", Bull. Chem. Soc. Japan., 1989, pp. 275-278, vol. 62, The Chemical Society of Japan.

"Chapter 1 Single Crystal Growth", Hydrothermal Synthesis Handbook, 1997, pp. 245-255, Gihodo Press.

R. A. Laudise, "What is Materials Chemistry?" Materials for Nonlinear Optics, 1991, pp. 411-433, American Chemical Society.

N. Sakagami et al., "Growth Kinetics and Morphology of ZnO Single Crystal Grown under Hydrothermal Conditions", Journal of Ceramic Association, 1974, pp. 405-413, vol. 82, No. 8.

T. Sekiguchi et al., "Hydrothermal Growth of ZnO Single Crystals and Their Optical Characterization", Journal of Crystal Growth, 2000, pp. 72-76, vol. 214/215, Elsevier Science B.V.

K. Yanagisawa et al. "Hydrothermal Single Crystal Growth of Calcite in Ammonium Acetate Solution", Journal of Crystal Growth, 1996, pp. 285-294, vol. 163, Elsevier Science B.V.

K. Yanagisawa et al., "Improvement of Quality of Hydrothermally Grown Calcite Single Crystals", Journal of Crystal Growth, 2001, pp. 440-444, vol. 229, Elsevier Science B.V.

S. Hirano et al. "Growth of Gallium Orthophosphate Single Crystals in Acidic Hydrothermal Solutions", Journal of Materials Science, 1991, pp. 2805-2808, vol. 26, Chapman and Hall Ltd.

Penkala, T., "Basics of Crystallography", PWN, 1972, p349, Warszawa.

Ikornikova, N., "Hydrothermal Synthesis of Crystals in Chloride Systems", Izd. Nauka, 1975, p124 and p133, Moscow.

Peters, D., "Ammonothermal Synthesis of Aluminium Nitride", Journal of Crystal Growth, 1990, pp. 411-418, vol. 104, Elsevier Science Publishers B. V., North-Holland.

Sangwal, K., "Elementary Crystal Growth", 1994, p331, Lublin.

Purdy, A., "Ammonothermal Synthesis of Cubic Gallium Nitride", Chem. Mater., 1999, pp. 1648-1651, vol. 11, The American ChemIcal Society.

Lan, Y. et al., "Syntheses and Structure of Nanocrystalline Gallium Nitride Obtained Form Ammonothermal Method Using Lithium Metal as Mineralizator", Material Research Bulletin, 2000, pp. 2325-2330, vol. 35, Elsevier Science Ltd.

Brandt, O. et al., "Critical Issues for the Growth of High-Quality (Al, Ga)N/GaN and GaN/(In, Ga)N Heterostructures on SiC(0001) by Molecular-Beam Expitaxy", Applied Physics Letters, Dec. 1999, pp. 4019-4021, vol. 75, No. 25, American Institute of Physics.

Waltereit, P. et al., "Nitride Semiconductors Free of Electrostatic Fields for Efficient White Light-Emitting Diodes", Letter to Nature, Aug. 2000, pp. 865-868, vol. 406.

Porowski, S., "High Pressure Growth of GaN—New Prospects for Blue Lasers", Journal of Crystal Growth, 1996, pp. 583-589, vol. 166, Elsevier Science B.V.

Fukuda, M., "Optical Semiconductor Devices", Wiley Series in Microwave and Optical Engineering, 1998, p. 7, John Wiley & Sons, Inc., New York.

Sze, S. M. (Editor), "Modern Semiconductor Device Physics", A Whiley Interscience Publication, 1998, pp. 539-540, John Wiley & Sons, Inc., New York.

Yamane, H. et al., "Na Flux Growth of GaN Single Crystals" Journal of the Japanese Association for Crystal Growth (JACG), 1998, pp. 14-18, vol. 25, No. 4, NACSIS-Electronic Library Service.

Yamane, H. et al., "Morphology and Characterization of GaN Single Crystals Grown in a Na Flux", Journal of Crystal Growth, 1998, pp. 8-12, vol. 186, Elsevier Science B. V.

Kelly, M. et al., "Optical Pattering of GaN Films", Appl. Phys. Ltt. Sep. 1996, pp. 1749-1751, vol. 69, No. 12, American Institute of Physics.

Kolis, J. et al., "Materials Chemistry and Bulk Crystal Growth of Group III Nitrides in Supercritical Ammonia" Mat. Res. Soc. Symp. Proc., 1998, pp. 367-372, vol. 495.

Wong, S. et al., "Fabrication of Thin-Film InGaN Light-Emitting Diode Membranes by Laser Lift Off" Sep. 1999. pp. 1360-1362, vol. 75, No. 10, American Institute of Physics.

Mao, X. et al. "New Concept Technology Pressure-Variation Liquid Phase Epitaxy", SPIE Photonics Taiwan Conference Proceedings, Jul. 2000, pp. 1-12.

Kato et al., "MOVPE Growth of GaN on Off-Angle Sapphire Substrate," IEICE Technical Report ED88-22~33, pp. 43-48, May 28, 1988, vol. 88 No. 61, The Institute of Electronics, Information and Communication Engineers of Japan, Kikai-Shinko-Kaikan Bldg., 5-8 Shbakoen 3 chome, Miatok-ku Tokyo 105 Japan.

Sakai et al., "Defect Structure in Selectively Grown GaN Films With Low Threading Dislocation Density," Applied Physics Letter., Oct. 20, 1997, pp. 2259-2261, vol. 71 No. 16, American Institute of Physics.

Japanese Notification of Reason(s) for Refusal, mailed Dec. 16, 2008, directed to Japanese Patent Application No. 2004-505416; 7 pages.

Japanese Notification of Reason(s) for Refusal, mailed Jan. 6, 2009, directed to Japanese Patent Application No. 2004-506101; 7 pages.

Japanese Provision of Relevant Information on Prior Arts of JP Application No, 2004-558483, mailed Dec. 24, 2008; 14 pages.

Canadian Office Action, mailed Apr. 2, 2009, directed to Canadian Patent Application No. 2,449,714; 4 pages.

U.S. Office Action, mailed Apr. 28, 2009, directed to U.S. Appl. No. 11/969,735; 26 pages.

Japanese Notification of Reason(s) for Refusal, mailed May 7, 2009, directed to Japanese Patent Application No. 2004-506141; 6 pages.

Japanese Notification of Reason(s) for Refusal, mailed May 12, 2009, directed to Japanese Patent Application No. 2003-544869; 6 pages.

U.S. Office Action, mailed Jun. 1, 2009, directed to U.S. Appl. No. 11/791,716; 8 pages.

Chinese Office Action, mailed Jun. 5, 2009, directed to Chinese Patent Application No. 200580040008.X; 13 pages.

Beaumont, B. et al. , "Expitaxial Lateral Overgrowth of GaN" physica status solidi, B, vol. 227, No. 1; p. 43.

Yano. M. et al. "Growth of nitride crystals, BN, AlN, and GaN by using a Na flux", Diamond and Related Materials, vol. 9 (2000), No. 3-6, pp. 512-515.

Chinese Office Action, directed to Chinese Patent Application No. 200580040008.X, issued on Jul. 18, 2008; 25 pages.

U.S. Office Action, directed to U.S. Appl. No. 10/538,654, dated Oct. 16, 2007; 10 pages.

U.S. Office Action, directed to U.S. Appl. No. 10/538,407, dated Apr. 4, 2007.

Supplemental European Search Report, directed to European Application No. 02788783.5, mailed on Sep. 23, 2008; 3 pages.

Porowski, S. et al. "Prospects for high-pressure crystal growth of III-V nitrides", Inst. Phys. Conf. Series, No. 137 (1993), Chapter 4, pp. 369-372.

Inoue, T. et al. Journal of Crystal Growth "Growth of bulk GaN single crystals by the pressure-controlled solution growth method" vol. 229 (2001), pp. 35-40.

Japanese Office Action, Notification of Reason(s) for Refusal directed to JP Patent Application No. 2003-538438, dated Jul. 28, 2009, 3 pages.

International Search Report, directed to PCT/JP03/15906, mailed on May 7, 2004; 3 pages.

Lui et al., "Substrates for gallium nitride expitaxy", Material Science and Engineering R, vol. 37 (2002), No. 3, pp. 61-127.

International Search Report, directed to PCT/PL03/00061, mailed on Sep. 27, 2004; 4 pages.

International Search Report, directed to PCT/JP2005/011019, mailed on Sep. 29, 2005; 3 pages.

Song et al., "Bulk GaN single crystals: growth conditions by flux method" Journal of crystal growth, vol. 247, No. 3-4, Jan. 2003, pp. 275-278.

Chinese Office Action, directed to Chinese Application No. 02802023.5, issued on Apr. 13, 2007; 9 pages.

Porowski, S. "High pressure growth of GaN—new prospects for blue lasers" Journal of crystal growth vol. 166 (1996), pp. 583-589.

International Search Report, directed to PCT/JP2005/022396, mailed on Apr. 21, 2006; 3 pages.

Communication pursuant to Article 94(3) EPC directed to European Patent Application No. 02 762 734.8, dated Oct. 21, 2009; 4 pages.

Notification of Reason(s) for Refusal directed to Japanese Patent Application No. 2004-506101, dated Nov. 4, 2009; 4 pages.

* cited by examiner

US 7,744,697 B2

BULK MONOCRYSTALLINE GALLIUM NITRIDE

This application is a divisional application of application Ser. No. 10/147,318 filed on May 17, 2002, now U.S. Pat. No. 6,656,615.

BACKGROUND OF THE INVENTION

1. Field of the Invention

The present invention refers to processes for obtaining a gallium-containing nitride crystal by an ammonobasic method as well as the gallium-containing nitride crystal itself. Furthermore, an apparatus for conducting the various methods is disclosed.

2. Discussion of the Related Art

Optoelectronic devices based on nitrides are usually manufactured on sapphire or silicon carbide substrates that differ from the deposited nitride layers (so-called heteroepitaxy). In the most often used Metallo-Organic Chemical Vapor Deposition (MOCVD) method, the deposition of GaN is performed from ammonia and organometallic compounds in the gas phase, and the growth rates achieved make it impossible to provide a bulk layer. The application of a buffer layer reduces the dislocation density, but not more than to approx. $10^8/cm^2$. Another method has also been proposed for obtaining bulk monocrystalline gallium nitride. This method consists of an epitaxial deposition employing halides in a vapor phase and is called Halide Vapor Phase Epitaxy (HVPE) ["Optical patterning of GaN films" M. K. Kelly, O. Ambacher, Appl. Phys. Lett. 69 (12) (1996) and "Fabrication of thin-film InGaN light-emitting diode membranes" W. S. Wrong, T. Sands, Appl. Phys. Lett. 75 (10) (1999)]. This method allows for the preparation of GaN substrates having a 2-inch diameter.

However, their quality is not sufficient for laser diodes, because the dislocation density continues to be approx. $10^7$ to approx. $10^9/cm^2$. Recently, the method of Epitaxial Lateral Overgrowth (ELOG) has been used for reducing the dislocation density. In this method the GaN layer is first grown on a sapphire substrate and then a layer with $SiO_2$ is deposited on it in the form of strips or a lattice. On the thus prepared substrate, in turn, the lateral growth of GaN may be carried out leading to a dislocation density of approx. $10^7/cm^2$.

The growth of bulk crystals of gallium nitride and other metals of group XIII (IUPAC, 1989) is extremely difficult. Standard methods of crystallization from melt and sublimation methods are not applicable because of the decomposition of the nitrides into metals and $N_2$. In the High Nitrogen Pressure (HNP) method ["Prospects for high-pressure crystal growth of III-V nitrides" S. Porowski et al., Inst. Phys. Conf. Series, 137, 369 (1998)] this decomposition is inhibited by the use of nitrogen under the high pressure. The growth of crystals is carried out in molten gallium, i.e. in the liquid phase, resulting in the production of GaN platelets about 10 mm in size. Sufficient solubility of nitrogen in gallium requires temperatures of about 1500° C. and nitrogen pressures in the order of 15 kbar.

The use of supercritical ammonia has been proposed to lower the temperature and decrease the pressure during the growth process of nitrides. Peters has described the ammonothermal synthesis of aluminium nitride [J. Cryst. Growth 104, 411-418 (1990)]. R. Dwiliński et al. have shown, in particular, that it is possible to obtain a fine-crystalline gallium nitride by a synthesis from gallium and ammonia, provided that the latter contains alkali metal amides ($KNH_2$ or $LiNH_2$). The processes were conducted at temperatures of up to 550° C. and under a pressure of 5 kbar, yielding crystals about 5 µm in size ["AMMONO method of BN, AlN, and GaN synthesis and crystal growth", Proc. EGW-3, Warsaw, Jun. 22-24, 1998, MRS Internet Journal of Nitride Semiconductor Research, http://nsr.mij.mrs.org/3/25]. Another supercritical ammonia method, where a fine-crystalline GaN is used as a feedstock together with a mineralizer consisting of an amide ($KNH_2$) and a halide (KI) also provided for recrystallization of gallium nitride ["Crystal growth of gallium nitride in supercritical ammonia" J. W. Kolis et al., J. Cryst. Growth 222, 431-434 (2001)]. The recrystallization process conducted at 400° C. and 3.4 kbar resulted in GaN crystals about 0.5 mm in size. A similar method has also been described in Mat. Res. Soc. Symp. Proc. Vol. 495, 367-372 (1998) by J. W. Kolis et al. However, using these supercritical ammonia processes, no production of bulk monocrystalline was achieved because no chemical transport processes were observed in the supercritical solution, in particular no growth on seeds was conducted.

SUMMARY OF THE INVENTION

Therefore, it is an object of the present invention to provide an improved method of preparing a gallium-containing nitride crystal.

The lifetime of optical semiconductor devices depends primarily on the crystalline quality of the optically active layers, and especially on the surface dislocation density. In case of GaN based laser diodes, it is beneficial to lower the dislocation density in the GaN substrate layer to less than $10^6/cm^2$, and this has been extremely difficult to achieve using the methods known so far. Therefore, a further object of the invention is to provide gallium-containing nitride crystals having a quality suitable for use as substrates for optoelectronics.

The above objects are achieved by the subject matter recited in the appended claims. In particular, in one embodiment the present invention refers to a process for obtaining a gallium-containing nitride crystal, comprising the steps of:

providing a gallium-containing feedstock, an alkali metal-containing component, at least one crystallization seed and a nitrogen-containing solvent in at least one container;

bringing the nitrogen-containing solvent into a supercritical state;

(iii) at least partially dissolving the gallium-containing feedstock at a first temperature and at a first pressure; and (iv) crystallizing gallium-containing nitride on the crystallization seed at a second temperature and at a second pressure while the nitrogen-containing solvent is in the supercritical state;

wherein at least one of the following criteria is fulfilled:

(a) the second temperature is higher than the first temperature; and (b) the second pressure is lower than the first pressure.

In a second embodiment a process for preparing a gallium-containing nitride crystal is described which comprises the steps of:

(i) providing a gallium-containing feedstock comprising at least two different components, an alkali metal-containing component, at least one crystallization seed and a nitrogen-containing solvent in a container having a dissolution zone and a crystallization zone, whereby the gallium-containing feedstock is provided in the dissolution zone and the at least one crystallization seed is provided in the crystallization zone;

(ii) subsequently bringing the nitrogen-containing solvent into a supercritical state;

(iii) subsequently partially dissolving the gallium-containing feedstock at a dissolution temperature and at a dissolution pressure in the dissolution zone, whereby a first component of the gallium-containing feedstock is substantially completely dissolved and a second component of the gallium-containing feedstock as well as the crystallization seed remain substantially undissolved so that an undersaturated solution with respect to gallium-containing nitride is obtained;

(iv) subsequently setting the conditions in the crystallization zone at a second temperature and at a second pressure so that over-saturation with respect to gallium-containing nitride is obtained and crystallization of gallium-containing nitride occurs on the at least one crystallization seed and simultaneously setting the conditions in the dissolution zone at a first temperature and at a first pressure so that the second component of the gallium-containing feedstock is dissolved;

wherein the second temperature is higher than the first temperature.

A gallium-containing nitride crystal obtainable by one of these processes is also described. Further subject matter of the invention are a gallium-containing nitride crystal having a surface area of more than 2 cm$^2$ and having a dislocation density of less than 10$^6$/cm$^2$ and a gallium-containing nitride crystal having a thickness of at least 200 μm and a full width at half maximum (FWHM) of X-ray rocking curve from (0002) plane of 50 arcsec or less.

The invention also provides an apparatus for obtaining a gallium-containing nitride crystal comprising an autoclave (1) having an internal space and comprising at least one device (4, 5, 6) for heating the autoclave to at least two zones having different temperatures, wherein the autoclave comprises a device which separates the internal space into a dissolution zone (13) and a crystallization zone (14).

In a yet another embodiment, a process for preparing a bulk monocrystalline gallium-containing nitride in an autoclave is disclosed, which comprises the steps of providing a supercritical ammonia solution containing gallium-containing nitride with ions of alkali metals, and recrystallizing said gallium-containing nitride selectively on a crystallization seed from said supercritical ammonia solution by means of the negative temperature coefficient of solubility and/or by means of the positive pressure coefficient of solubility.

A process for controlling recrystallization of a gallium-containing nitride in a supercritical ammonia solution which comprises steps of providing a supercritical ammonia solution containing a gallium-containing nitride as a gallium complex with ions of alkali metal and NH$_3$ solvent in an autoclave and decreasing the solubility of said gallium-containing nitride in the supercritical ammonia solution at a temperature less than that of dissolving gallium-containing nitride crystal and/or at a pressure higher than that of dissolving gallium-containing nitride crystal is also disclosed.

DETAILED DESCRIPTION OF THE PREFERRED EMBODIMENTS

Figure 1:
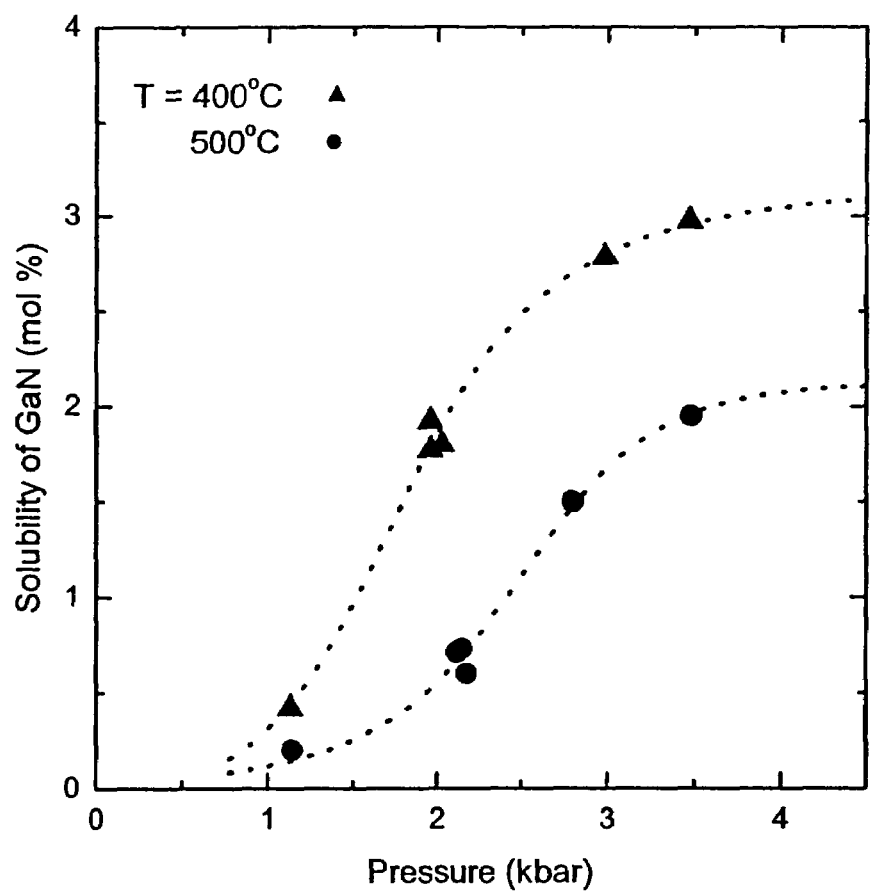
FIG. 1 shows the dependency of the solubility of gallium-containing nitride in supercritical ammonia that contains potassium amide (with KNH$_2$:NH$_3$=0.07) on pressure at T=400° C. and T=500° C.

In the present invention the following definitions apply.

Gallium-containing nitride means a nitride of gallium and optionally other element(s) of group XIII (according to IUPAC, 1989). It includes, but is not restricted to, the binary compound GaN, ternary compounds such as AlGaN, InGaN and also AlInGaN, where the ratio of the other elements of group XIII to Ga can vary in a wide range.

Bulk monocrystalline gallium-containing nitride means a monocrystalline substrate made of gallium-containing nitride from which optoelectronic devices such as LED or LD can be formed by epitaxial methods such as MOCVD and HVPE.

Supercritical solvent means a fluid in a supercritical state. It can also contain other components in addition to the solvent itself as long as these components do not substantially influence or disturb function of supercritical solvent. In particular, the solvent can contain ions of alkali metals.

Supercritical solution is used when referring to the supercritical solvent when it contains gallium in a soluble form originating from the dissolution of gallium-containing feedstock.

Dissolution of gallium-containing feedstock means a process (either reversible or irreversible) in which said feedstock is taken up to the supercritical solvent as gallium in a soluble form, possibly gallium-complex compounds.

Gallium-complex compounds are complex compounds, in which a gallium atom is a coordination center surrounded by ligands, such as NH$_3$ molecules or its derivatives, like NH$_2^-$, NH$^{2-}$, etc.

Negative temperature coefficient of solubility means that the solubility of the respective compound is a monotonically decreasing function of temperature if all other parameters are kept constant. Similarly, positive pressure coefficient of solubility means that, if all other parameters are kept constant, the solubility is a monotonically increasing function of pressure. In our research we showed that the solubility of gallium-containing nitride in supercritical nitrogen-containing solvents, such as ammonia, possesses a negative temperature coefficient and a positive pressure coefficient in temperatures ranging at least from 300 to 600° C. and pressures from 1 to 5.5 kbar.

Over-saturation of supercritical solution with respect to gallium-containing nitride means that the concentration of gallium in a soluble form in said solution is higher than that in equilibrium (i.e. it is higher than solubility). In the case of dissolution of gallium-containing nitride in a closed system, such an over-saturation can be achieved by either increasing the temperature and/or decreasing the pressure.

Spontaneous crystallization means an undesired process where nucleation and growth of the gallium-containing nitride from over-saturated supercritical solution take place at any site within an autoclave except at the surface of a seed crystal where the growth is desired. Spontaneous crystallization also comprises nucleation and disoriented growth on the surface of seed crystal.

Selective crystallization on a seed means a process of crystallization on a seed carried out without spontaneous crystallization.

Autoclave means a closed container which has a reaction chamber where the ammonobasic process according to the present invention is carried out.

The present invention can provide a gallium-containing nitride monocrystal having a large size and a high quality. Such gallium-containing nitride crystals can have a surface area of more than 2 cm$^2$ and a dislocation density of less than 10$^6$/cm$^2$. Gallium-containing nitride crystals having a thickness of at least 200 µm (preferably at least 500 µm) and a FWHM of 50 arcsec or less can also be obtained. Depending on the crystallization conditions, it possible to obtain gallium-containing nitride crystals having a volume of more than 0.05 cm$^3$, preferably more than 0.1 cm$^3$ using the processes of the invention.

As was explained above, the gallium-containing nitride crystal is a crystal of nitride of gallium and optionally other element(s) of Group XIII (the numbering of the Groups is given according to the IUPAC convention of 1989 throughout this application). These compounds can be represented by the formula $Al_xGa_{1-x-y}In_yN$, wherein $0 \leq x<1$, $0 \leq y<1$, $0 \leq x+y<1$; preferably $0 \leq x<0.5$ and $0 \leq y<0.5$. Although in a preferred embodiment, the gallium-containing nitride is gallium nitride, in a further preferred embodiment part (e.g. up to 50 mol.-%) of the gallium atoms can be replaced by one or more other elements of Group XIII (especially Al and/or In).

The gallium-containing nitride may additionally include at least one donor and/or at least one acceptor and/or at least one magnetic dopant to alter the optical, electrical and magnetic properties of the substrate. Donor dopants, acceptor dopants and magnetic dopants are well-known in the art and can be selected according to the desired properties of the substrate. Preferably the donor dopants are selected from the group consisting of Si and O. As acceptor donors Mg and Zn are preferred. Any known magnetic dopant can be included into the substrates of the present invention. A preferred magnetic dopant is Mn and possibly also Ni and Cr. The concentrations of the dopants are well-known in the art and depend on the desired end application of the nitride. Typically the concentrations of these dopants are ranging from 10$^{17}$ to 10$^{21}$/cm$^3$.

Due to the production process the gallium-containing nitride crystal can also contain alkali elements, usually in an amount of more than about 0.1 ppm. Generally it is desired to keep the alkali elements content lower than 10 ppm, although it is difficult to specify what concentration of alkali metals in gallium-containing nitride has a disadvantageous influence on its properties.

It is also possible that halogens are present in the gallium-containing nitride. The halogens can be introduced either intentionally (as a component of the mineralizer) or unintentionally (from impurities of the mineralizer or the feedstock). It is usually desired to keep the halogen content of the gallium-containing nitride crystal in the range of about 0.1 ppm or less.

The process of the invention is a supercritical crystallization process, which includes at least two steps: a dissolution step at a first temperature and at a first pressure and a crystallization step at a second temperature and at a second pressure. Since generally high pressures and/or high temperatures are involved, the process according to the invention is preferably conducted in an autoclave. The two steps (i.e. the dissolution step and the crystallization step) can either be conducted separately or can be conducted at least partially simultaneously in the same reactor.

For conducting the two steps separately the process can be conducted in one reactor but the dissolution step is conducted before the crystallization step. In this embodiment the reactor can have the conventional construction of one single chamber. The process of the invention in the two-step embodiment can be conducted using constant pressure and two different temperatures or using constant temperature and two different pressures. It is also possible to use two different pressures and two different temperatures. The exact values of pressure and temperature should be selected depending on the feedstock, the specific nitride to be prepared and the solvent. Generally the pressure is in the range of 1 to 10 kbar, preferably 1 to 5.5 and more preferably 1.5 to 3 kbar. The temperature is in the range of 100° C. to 800° C., preferably 300° C. to 600° C., more preferably 400° C. to 550° C. If two different pressures are employed, the difference in pressure should be from 0.1 kbar to 9 kbar, preferably from 0.2 kbar to 3 kbar. However, if the dissolution and crystallization are controlled by the temperature, the difference in temperature should be at least 1° C., and preferably from 5° C. to 150° C.

In a preferred embodiment, the dissolution step and the crystallization step are conducted at least partially simultaneously in the same container. For such an embodiment the pressure is practically uniform within the container, while the temperature difference between the dissolution zone and crystallization zone should be at least 1° C., and preferably is from 5° C. to 150° C. Furthermore, the temperature difference between the dissolution zone and crystallization zone should be controlled so as to ensure chemical transport in the supercritical solution, which takes place through convection.

Figure 9:
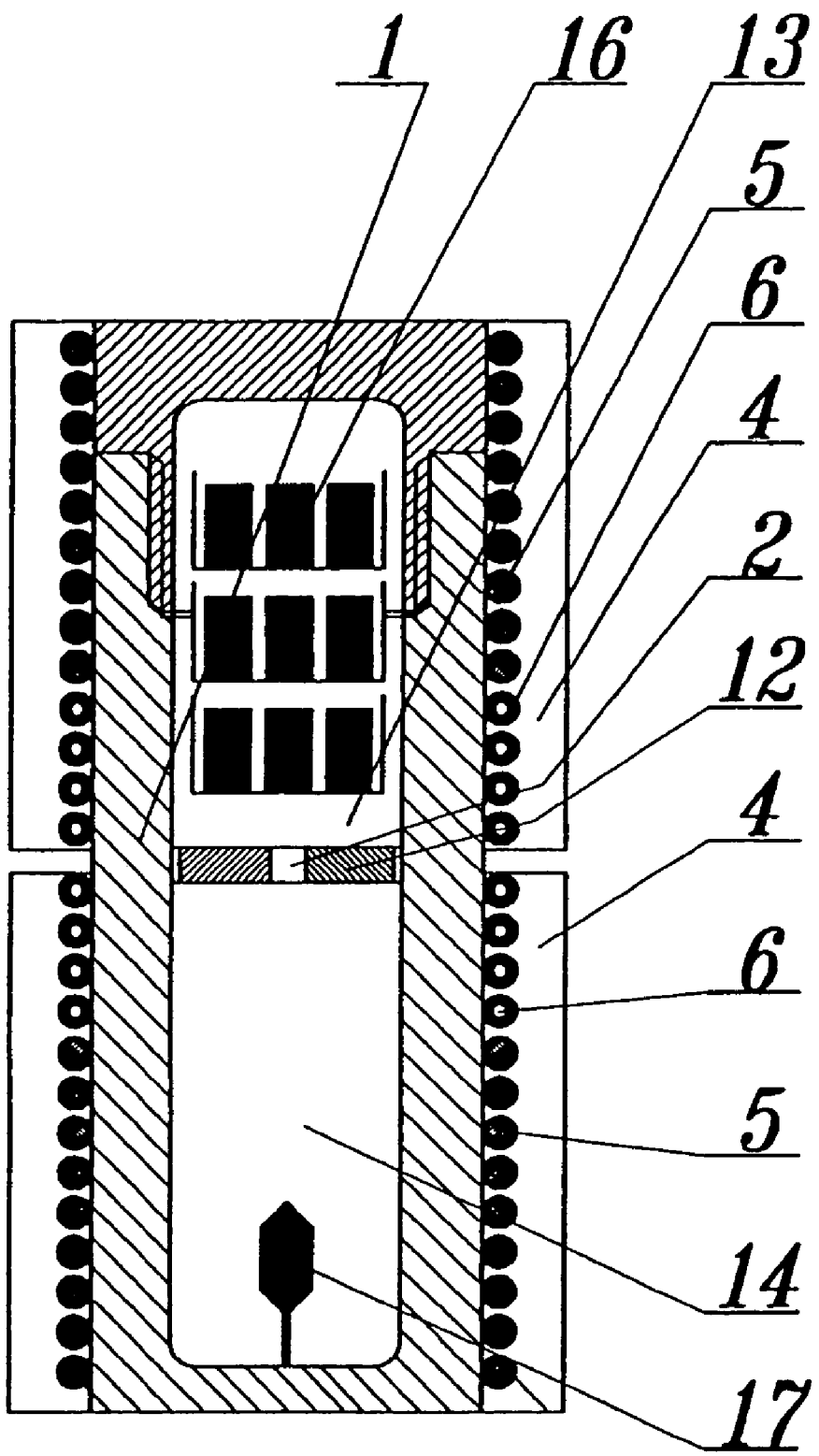
FIG. 9 shows a schematic axial cross section of an autoclave as employed in many of the examples, mounted in the furnace.
Figure 10:
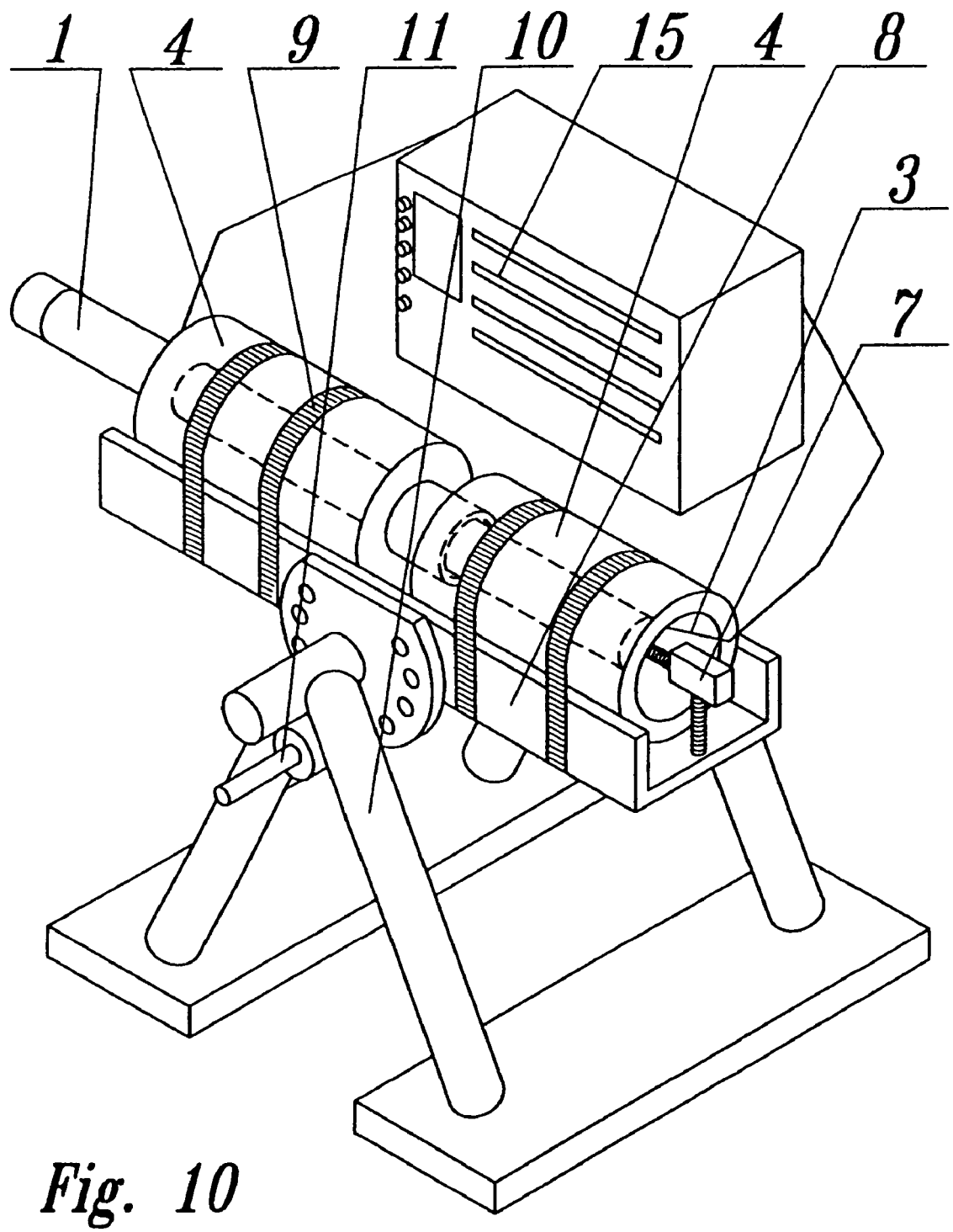
FIG. 10 is a schematic perspective drawing of an apparatus according to the present invention.

A possible construction of a preferred container is given in FIG. 9. For conciseness and ease of understanding in the following, the process will be explained particularly with respect to this preferred embodiment. However, the invention can be conducted with different container constructions as long as the principles outlined in the specification and the claims are adhered to.

In a preferred embodiment of the invention, the process can be conducted in an apparatus comprising an autoclave 1 having an internal space and comprising at least one device 4, 5, 6 for heating the autoclave to at least two zones having different temperatures, wherein the autoclave comprises a device which separates the internal space into a dissolution zone 13 and a crystallization zone 14. These two zones having different temperatures should preferably coincide with the dissolution zone 13 and the crystallization zone 14. The device which separates the internal space of the autoclave can be, for example, at least one baffle 12 having at least one opening 2. Examples are baffles having a central opening, circumferential openings or a combination thereof. The size of the opening(s) 2 should be large enough to allow transport between the zones but should be sufficiently small to maintain a temperature gradient in the reactor. The appropriate size of the opening depends on the size and the construction of the reactor and can be easily determined by a person skilled in the art.

In one embodiment, two different heating devices can be employed, the position of which corresponds to dissolution zone 13 and the crystallization zone 14. However, it has been observed that transport of gallium in a soluble form from the dissolution zone 13 to the crystallization zone 14 can be further improved if a third cooling means 6 is present between the first and the second heating devices and is located at approximately the position of the separating device. The cooling means 6 can be realized by liquid (e.g. water) cooling or preferably by fan cooling. The heating devices are powered electrically, by either inductive or, preferably, resistive heating means. Use of a heating 4—cooling 6—heating 5 configuration gives wider possibilities in forming the desired temperature distribution within the autoclave. For example, it enables to obtain low temperature gradients in most of the crystallization zone 14 and of the dissolution zone 13, and a high temperature gradient in the region of baffle 12.

When the process of the present invention is conducted, providing a gallium-containing feedstock, an alkali metal-containing component, at least one crystallization seed and a nitrogen-containing solvent are provided in at least one container. In the preferred apparatus described above, the gallium-containing feedstock is placed in the dissolution zone and the at least one crystallization seed is placed in the crystallization zone. The alkali metal containing component is also preferably placed in the dissolution zone. Then the nitrogen-containing solvent is added into the container, which is then closed. Subsequently the nitrogen-containing solvent is brought into a supercritical state, e.g. by pressure and/or heat.

In the present invention any materials containing gallium, which are soluble in the supercritical solvent under the conditions of the present invention, can be used as a gallium-containing feedstock. Typically the gallium-containing feedstock will be a substance or mixture of substances, which contains at least gallium, and optionally alkali metals, other Group XIII elements, nitrogen, and/or hydrogen, such as metallic Ga, alloys and inter-metallic compounds, hydrides, amides, imides, amido-imides, azides. Suitable gallium-containing feedstocks can be selected from the group consisting of gallium nitride GaN, azides such as $Ga(N_3)_3$, imides such as $Ga_2(NH)_3$, amido-imides such as $Ga(NH)NH_2$, amides such as $Ga(NH_2)_3$, hydrides such as $GaH_3$, gallium-containing alloys, metallic gallium and mixtures thereof. Preferred feedstocks are metallic gallium and gallium nitride and mixtures thereof. Most preferably, the feedstock is metallic gallium or gallium nitride. If other elements of Group XIII are to be incorporated into the gallium-containing nitride crystal, corresponding compounds or mixed compounds including Ga and the other Group XIII element can be used. If the substrate is to contain dopants or other additives, precursors thereof can be added to the feedstock.

The form of the feedstock is not particularly limited and it can be in the form of one or more pieces or in the form of a powder. If the feedstock is in the form of a powder, care should be taken that individual powder particles are not transported from the dissolution zone to the crystallization zone, where they can cause irregular crystallization. It is preferable that the feedstock is in one or more pieces and that the surface area of the feedstock is larger than that of the crystallization seed.

The nitrogen-containing solvent employed in the present invention must be able to form a supercritical fluid, in which gallium can be dissolved in the presence of alkali metal ions. Preferably the solvent is ammonia, a derivative thereof or mixtures thereof. An example of a suitable ammonia derivative is hydrazine. Most preferably the solvent is ammonia. To reduce corrosion of the reactor and to avoid side-reactions, halogens e.g. in the form of halides are preferably not intentionally added into the reactor. Although traces of halogens may be introduced into the system in the form of unavoidable impurities of the starting materials, care should be taken to keep the amount of halogen as low as possible. Due to the use of a nitrogen-containing solvent such as ammonia it is not necessary to include nitride compounds into the feedstock. Metallic gallium (or aluminum or indium) can be employed as the source material while the solvent provides the nitrogen required for the nitride formation.

It has been observed that the solubility of gallium-containing feedstock, such as gallium and corresponding elements of Group XIII and/or their compounds, can be significantly improved by the presence of at least one type of alkali metal-containing component as a solubilization aid ("mineralizer"). Lithium, sodium and potassium are preferred as alkali metals, wherein sodium and potassium are more preferred. The mineralizer can be added to the supercritical solvent in elemental form or preferably in the form of its compound. Generally the choice of the mineralizer depends on the solvent employed in the process. According to our investigations, alkali metal having a smaller ion radius can provide lower solubility of gallium-containing nitride in the supercritical ammonia solvent than that obtained with alkali metals having a larger ion radius. For example, if the mineralizer is in the form of a compound, it is preferably an alkali metal hydride such as MH, an alkali metal nitride such as $M_3N$, an alkali metal amide such as $MNH_2$, an alkali metal imide such as $M_2NH$ or an alkali metal azide such as $MN_3$ (wherein M is an alkali metal). The concentration of the mineralizer is not particularly restricted and is selected so as to ensure adequate levels of solubility of both feedstock (the starting material) and gallium-containing nitride (the resulting product). It is usually in the range of 1:200 to 1:2, in the terms of the mols of the metal ion based on the mols of the solvent (molar ratio). In a preferred embodiment the concentration is from 1:100 to 1:5, more preferably 1:20 to 1:8 mols of the metal ion based on the mols of the solvent.

The presence of the alkali metal in the process can lead to alkali metal elements in the thus prepared substrates. It is possible that the amount of alkali metal elements is more than about 0.1 ppm, even more than 10 ppm. However, in these amounts the alkali metals do not detrimentally effect the properties of the substrates. It has been found that even at an alkali metal content of 500 ppm, the operational parameters of the substrate according to the invention are still satisfactory.

The dissolved feedstock crystallizes in the crystallization step under the low solubility conditions on the crystallization seed(s) which are provided in the container. The process of the invention allows bulk growth of monocrystalline gallium-containing nitride on the crystallization seed(s) and in particular leads to the formation of stoichiometric nitride in the form of a monocrystalline bulk layer on the crystallization seed(s).

Various crystals can be used as crystallization seeds in the present invention, however, it is preferred that the chemical and crystallographic constitution of the crystallization seeds is similar to those of the desired layer of bulk monocrystalline gallium-containing nitride. Therefore, the crystallization seed preferably comprises a crystalline layer of gallium-containing nitride and optionally one or more other elements of Group XIII. To facilitate crystallization of the dissolved feedstock, the defects surface density of the crystallization seed is preferably less than $10^6/cm^2$. Suitable crystallization seeds generally have a surface area of $8 \times 8$ $mm^2$ or more and thickness of 100 μm or more, and can be obtained e.g. by HVPE.

After the starting materials have been introduced into the container and the nitrogen-containing solvent has been brought into its supercritical state, the gallium-containing feedstock is at least partially dissolved at a first temperature and a first pressure, e.g. in the dissolution zone of an autoclave. Gallium-containing nitride crystallizes on the crystallization seed (e.g. in the crystallization zone of an autoclave) at a second temperature and at a second pressure while the nitrogen-containing solvent is in the supercritical state, wherein the second temperature is higher than the first temperature and/or the second pressure is lower than the first pressure. If the dissolution and the crystallization steps take place simultaneously in the same container, the second pressure is essentially equal to the first pressure.

This is possible since the solubility of gallium-containing nitride under the conditions of the present invention shows a negative temperature coefficient and a positive pressure coefficient in the presence of alkali metal ions. Without wishing to be bound by theory, it is postulated that the following processes occur. In the dissolution zone, the temperature and pressure are selected such that the gallium-containing feedstock is dissolved and the nitrogen-containing solution is undersaturated with respect to gallium-containing nitride. At the crystallization zone, the temperature and pressure are selected such that the solution, although it contains approximately the same concentration of gallium as in the dissolution zone, is over-saturated with respect to gallium-containing nitride. Therefore, crystallization of gallium-containing nitride on the crystallization seed occurs. This is illustrated in FIG. 15. Due to the temperature gradient, pressure gradient, concentration gradient, different chemical or physical character of dissolved feedstock and crystallized product etc., gallium is transported in a soluble form from the dissolution zone to the crystallization zone. In the present invention this is referred to as chemical transport of gallium-containing nitride in the supercritical solution. It is postulated that the soluble form of gallium is a gallium complex compound, with Ga atom in the coordination center surrounded by ligands, such as $NH_3$ molecules or its derivatives, like $NH_2^-$, $NH^{2-}$, etc.

This theory is equally applicable for all gallium-containing nitrides, such as AlGaN, InGaN and AlInGaN as well as GaN (the mentioned formulas are only intended to give the components of the nitrides. It is not intended to indicate their relative amounts). In such cases also aluminum and/or indium in a soluble form have to be present in the supercritical solution.

In a preferred embodiment of the invention, the gallium-containing feedstock is dissolved in at least two steps. In this embodiment, the gallium-containing feedstock generally comprises two kinds of starting materials which differ in solubility. The difference in solubility can be achieved chemically (e.g. by selecting two different chemical compounds) or physically (e.g. by selecting two forms of the same compound having definitely different surface areas, like microcrystalline powder and big crystals). In a preferred embodiment, the gallium-containing feedstock comprises two different chemical compounds such as metallic gallium and gallium nitride which dissolve at different rates. In a first dissolution step, the first component of the gallium-containing feedstock is substantially completely dissolved at a dissolution temperature and at a dissolution pressure in the dissolution zone. The dissolution temperature and the dissolution pressure, which can be set only in the dissolution zone or preferably in the whole container, are selected so that the second component of the gallium-containing feedstock and the crystallization seed(s) remain substantially undissolved. This first dissolution step results in an undersaturated or at most saturated solution with respect to gallium-containing nitride. For example, the dissolution temperature can be 100° C. to 350° C., preferably from 150° C. to 300° C. The dissolution pressure can be 0.1 kbar to 5 kbar, preferably from 0.1 kbar to 3 kbar. Generally the dissolution temperature is lower than the first temperature.

Subsequently the conditions in the crystallization zone are set at a second temperature and at a second pressure so that over-saturation with respect to gallium-containing nitride is obtained and crystallization of gallium-containing nitride occurs on the at least one crystallization seed. Simultaneously the conditions in the dissolution zone are set at a first temperature and at a first pressure (practically equal to the second pressure) so that the second component of the gallium-containing feedstock is now dissolved (second dissolution step). As explained above the second temperature is higher than the first temperature and/or the second pressure is lower than the first pressure so that the crystallization can take advantage of the negative temperature coefficient of solubility and/or by means of the positive pressure coefficient of solubility. Preferably the first temperature is also higher than the dissolution temperature. During the second dissolution step and the crystallization step, the system should be in a stationary state so that the concentration of gallium in the supercritical solution remains substantially constant, i.e. the same amount of gallium should be dissolved per unit of time as is crystallized in the same unit of time. This allows for the growth of gallium-containing nitride crystals of especially high quality and large size.

Typical pressures for the crystallization step and the second dissolution step are in the range of 1 to 10 kbar, preferably 1 to 5.5 and more preferably 1.5 to 3 kbar. The temperature is in the range of 100 to 800° C., preferably 300 to 600° C., more preferably 400 to 550° C. The difference in temperature should be at least 1° C., and preferably from 5° C. to 150° C. As explained above, the temperature difference between the dissolution zone and crystallization zone should be controlled so as to ensure a chemical transport in the supercritical solution, which takes place through convection in an autoclave.

In the process of the invention, the crystallization should take place selectively on the crystallization seed and not on a wall of the container. Therefore, the over-saturation extent with respect to the gallium-containing nitride in the supercritical solution in the crystallization zone should be controlled so as to be below the spontaneous crystallization level where crystallization takes place on a wall of the autoclave as well as on the seed, i.e. the level at which spontaneous crystallization occurs. This can be achieved by adjusting the chemical transport rate and the crystallization temperature and/or pressure. The chemical transport is related on the speed of a convection flow from the dissolution zone to the crystallization zone, which can be controlled by the temperature difference between the dissolution zone and the crystallization zone, the size of the opening(s) of baffle(s) between the dissolution zone and the crystallization zone and so on.

The performed tests showed that the best bulk monocrystalline gallium nitride obtained had the dislocation density close to $10^4/cm^2$ with simultaneous FWHM of X-ray rocking curve from (0002) plane below 60 arcsec, providing an appropriate quality and durability for optic semiconductor devices produced with its use. The gallium-containing nitride of the present invention typically has a wurzite structure.

Feedstock material can also be prepared using a method similar to those described above. The method involves the steps of:

(i) providing a gallium-containing feedstock, an alkali metal-containing component, at least one crystallization seed and a nitrogen-containing solvent in a container having at least one zone;

(ii) subsequently bringing the nitrogen-containing solvent into a supercritical state;

(iii) subsequently dissolving the gallium-containing feedstock (such as metallic gallium or aluminium or indium, preferably metallic gallium) at a dissolution temperature and at a dissolution pressure, whereby the gallium-containing feedstock is substantially completely dissolved and the crystallization seed remains substantially undissolved so that an undersaturated solution with respect to gallium-containing nitride is obtained;

(iv) subsequently setting the conditions in the container at a second temperature and at a second pressure so that oversaturation with respect to gallium-containing nitride is obtained and crystallization of gallium-containing nitride occurs on the at least one crystallization seed;

wherein the second temperature is higher than the dissolution temperature.

The conditions described above with respect to the dissolution temperature and the second temperature also apply in this embodiment.

Gallium-containing nitride exhibits good solubility in supercritical nitrogen-containing solvents (e.g. ammonia), provided alkali metals or their compounds, such as $KNH_2$, are introduced into it. FIG. 1 shows the solubility of gallium-containing nitride in a supercritical solvent versus pressure for temperatures of 400 and 500° C. wherein the solubility is defined by the molar percentage: $S_m \equiv GaN^{solvent}$: $(KNH_2 + NH_3)$ 100%. In the presented case the solvent is the $KNH_2$ solution in supercritical ammonia of a molar ratio $x \equiv KNH_2$: $NH_3$ equal to 0.07. For this case $S_m$ should be a smooth function of only three parameters: temperature, pressure, and molar ratio of mineralizer (i.e. $S_m = S_m(T, p, x)$). Small changes of $S_m$ can be expressed as:

$$\Delta S_m \approx (\partial S_m/\partial T)|_{p,x} \Delta T + (\partial S_m/\partial p)|_{T,x} \Delta p + (\partial S_m/\partial x)|_{T,p} \Delta x,$$

where the partial differentials (e.g. $(\partial S_m/\partial T)|_{p,x}$) determine the behavior of $S_m$ with variation of its parameters (e.g. T). In this specification the partial differentials are called "coefficients" (e.g. $(\partial S_m/\partial T)|_{p,x}$ is a "temperature coefficient of solubility").

The diagram shown FIG. 1 illustrates that the solubility increases with pressure and decreases with temperature, which means that it possesses a negative temperature coefficient and a positive pressure coefficient. Such features allow obtaining a bulk monocrystalline gallium-containing nitride by dissolution in the higher solubility conditions, and crystallization in the lower solubility conditions. In particular, the negative temperature coefficient means that, in the presence of temperature gradient, the chemical transport of gallium in a soluble form can take place from the dissolution zone having a lower temperature to the crystallization zone having a higher temperature.

The process according to invention allows the growth of bulk monocrystalline gallium-containing nitride on the seed and leads in particular to creation of stoichiometric gallium nitride, obtained in the form of monocrystalline bulk layer grown on a gallium-nitride seed. Since such a monocrystal is obtained in a supercritical solution that contains ions of alkali metals, it contains also alkali metals in a quantity higher than 0.1 ppm. Because it is desired to maintain a purely basic character of a supercritical solution, mainly in order to avoid corrosion of the apparatus, halides are preferably not intentionally introduced into the solvent. The process of the invention can also provide a bulk monocrystalline gallium nitride in which part of the gallium, e.g. from 0.05 to 0.5 may be substituted by Al and/or In. Moreover, the bulk monocrystalline gallium nitride may be doped with donor and/or acceptor and/or magnetic dopants. These dopants can modify optical, electric and magnetic properties of a gallium-containing nitride. With respect to the other physical properties, the bulk monocrystalline gallium nitride can have a dislocation density below $10^6/cm^2$, preferably below $10^5/cm^2$, or most preferably below $10^4/cm^2$. Besides, the FWHM of the X-ray rocking curve from (0002) plane can be below 600 arcsec, preferably below 300 arcsec, and most preferably below 60 arcsec. The best bulk monocrystalline gallium nitride obtained may have dislocation density lower than $10^4/cm^2$ and simultaneously a FWHM of X-ray rocking curve from (0002) plane below 60 arcsec.

Due to the good crystalline quality the obtained gallium-containing nitride crystals obtained in the present invention, they may be used as a substrate material for optoelectronic semiconductor devices based on nitrides, in particular for laser diodes.

The following examples are intended to illustrate the invention and should not be construed as being limiting.

EXAMPLES

Since it is not possible to readily measure the temperature in an autoclave while in use under supercritical conditions, the temperature in the autoclave was estimated by the following method. The outside of the autoclave is equipped with thermocouples near the dissolution zone and the crystallization zone. For the calibration, additional thermocouples were introduced into the inside of the empty autoclave in the dissolution zone and the crystallization zone. The empty autoclave was then heated stepwise to various temperatures and the values of the temperature of the thermocouples inside the autoclave and outside the autoclave were measured and tabulated. For example, if the temperature of the crystallization zone is determined to be 500° C. and the temperature of the dissolution zone is 400° C. inside the empty autoclave when the temperature measured by the outside thermocouples are 480° C. and 395° C., respectively. It is assumed that under supercritical crystallization conditions the temperatures in the crystallization/dissolution zones will also be 500/400° C. when temperatures of 480/395° C. are measured by the outside thermocouples. In reality, the temperature difference between the two zones can be lower due to effective heat transfer through the supercritical solution.

Example 1

Figure 2:
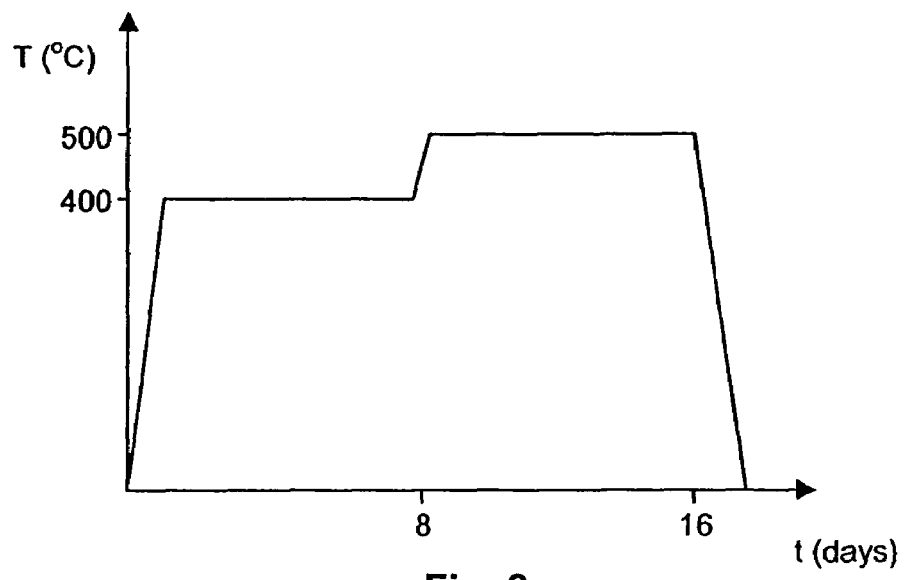
FIG. 2 shows the diagram of time variations of temperature in an autoclave at constant pressure for Example 1.

Two crucibles were placed into a high-pressure autoclave having a volume of 10.9 $cm^3$. The autoclave is manufactured according to a known design [H. Jacobs, D. Schmidt, *Current Topics in Materials Science*, vol. 8, ed. E. Kaldis (North-Holland, Amsterdam, 1981), 381]. One of the crucibles contained 0.4 g of gallium nitride in the form of 0.1 mm thick plates produced by the HVPE method as feedstock, while other contained a gallium nitride seed of a double thickness weighing 0.1 g. The seed was also obtained by the HVPE method. Further, 0.72 g of metallic potassium of 4N purity was placed in the autoclave, the autoclave was filled with 4.81 g of ammonia and then closed. The autoclave was put into a furnace and heated to the temperature of 400° C. The pressure within the autoclave was 2 kbar. After 8 days the temperature was increased to 500° C., while the pressure was maintained at the 2 kbar level and the autoclave was maintained under these conditions for another 8 days (FIG. 2). As a result of this process, in which the dissolution and crystallization steps were separated in time, the feedstock was completely dissolved and the recrystallization of gallium nitride layer took place on the partially dissolved seed. The two-sided monocrystalline layers had a total thickness of about 0.4 mm.

Example 2

Figure 3:
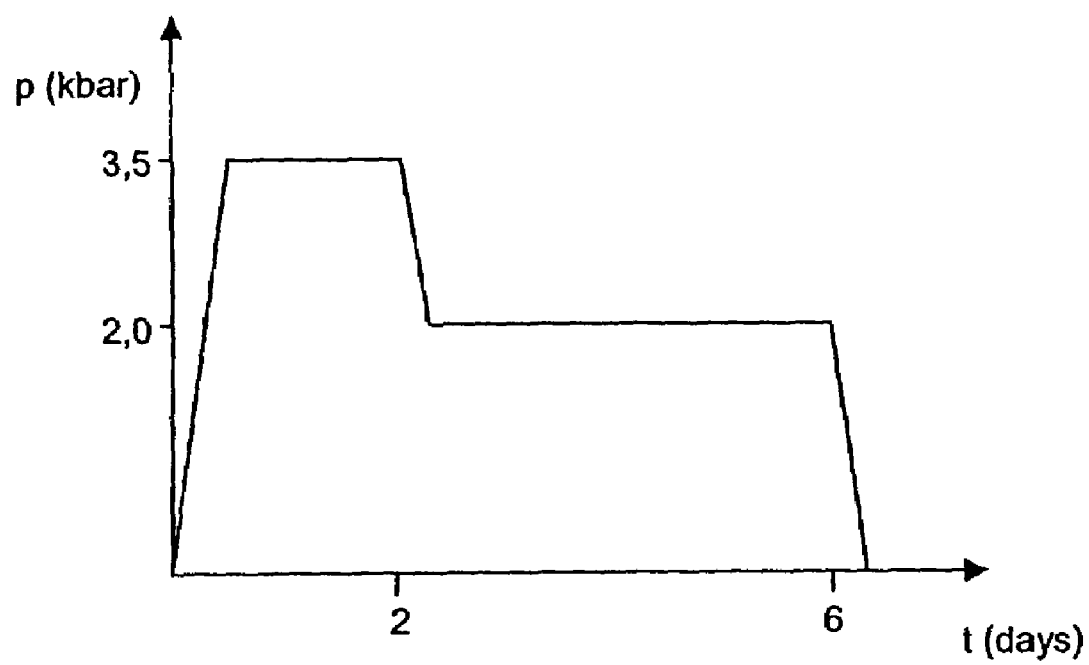
FIG. 3 shows the diagram of time variations of pressure in an autoclave at constant temperature for Example 2.

Two crucibles were put into the above-mentioned high-pressure autoclave having a volume of 10.9 cm$^3$. One of the crucibles contained 0.44 g of gallium nitride in the form of 0.1 mm thick plates produced by the HVPE method as feedstock, and the other contained a gallium nitride seed of a double thickness weighing 0.1 g, also obtained by the HVPE method. Further, 0.82 g of metallic potassium of 4N purity was placed in the autoclave, the autoclave was filled with 5.43 g of ammonia and then closed. The autoclave was put into a furnace and heated to temperature of 500° C. The pressure within the autoclave was 3.5 kbar. After 2 days the pressure was lowered to 2 kbar, while the temperature was maintained at the 500° C. level and the autoclave was maintained under these conditions for another 4 days (FIG. 3). As a result of this process, the feedstock was completely dissolved and the recrystallization of gallium nitride took place on the partially dissolved seed. The two-sided monocrystalline layers had a total thickness of about 0.25 mm.

Example 3

Figure 4:
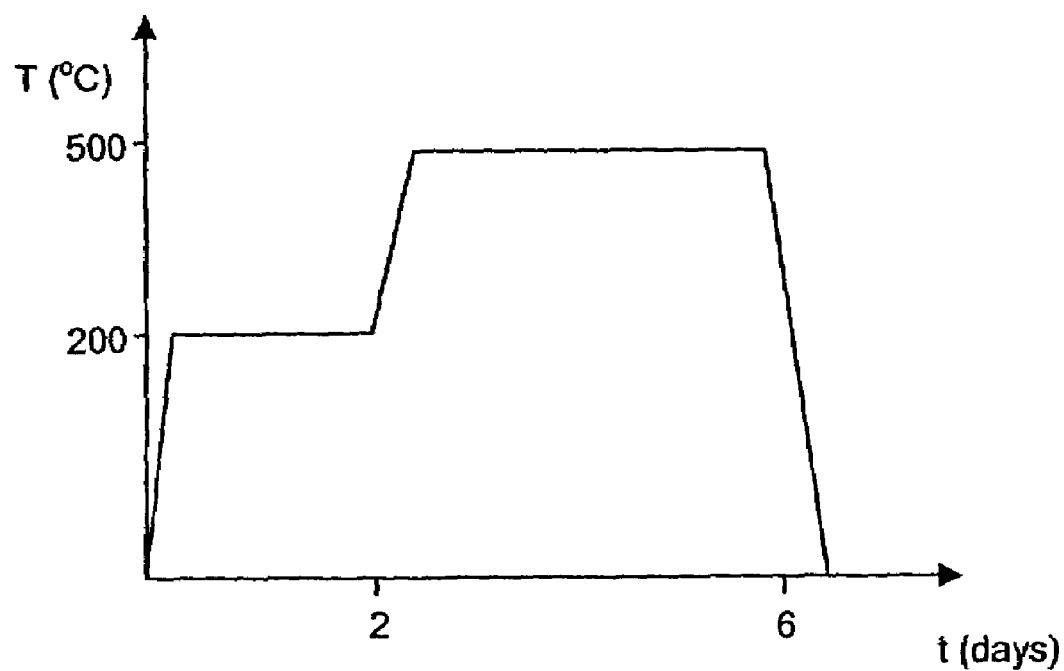
FIG. 4 shows the diagram of time variations of temperature in an autoclave at constant volume for Example 3.

Two crucibles were placed into the above-mentioned high-pressure autoclave having a volume of 10.9 cm$^3$. One of the crucibles contained 0.3 g of the feedstock in the form of metallic gallium of 6N purity and the other contained a 0.1 g gallium nitride seed obtained by the HVPE method. Further, 0.6 g of metallic potassium of 4N purity was placed in the autoclave; the autoclave was filled with 4 g of ammonia and then closed. The autoclave was put into a furnace and heated to temperature of 200° C. After 2 days the temperature was increased to 500° C., while the pressure was maintained at the 2 kbar level and the autoclave was maintained in these conditions for further 4 days (FIG. 4). As a result of this process, the feedstock was completely dissolved and the crystallization of gallium nitride took place on the seed. The two-sided monocrystalline layers had a total thickness of about 0.3 mm.

Example 4

This is an example of process, in which the dissolution and crystallization steps take place simultaneously (recrystallization process). In this example and all the following an apparatus is used which is schematically shown in FIG. 9. The basic unit of the apparatus is the autoclave 1, which in this Example has a volume of 35.6 cm$^3$. The autoclave 1 is equipped with an installation 2 for providing chemical transport of the solvent in a supercritical solution inside the autoclave 1. For this purpose, the autoclave 1 is put into a chamber 3 of a set of two furnaces 4 provided with heating devices 5 and a cooling devices 6. The autoclave 1 is secured in a desired position with respect to the furnaces 4 by means of a screw-type blocking device 7. The furnaces 4 are mounted on a bed 8 and are secured by means of steel tapes 9 wrapped around the furnaces 4 and the bed 8. The bed 8 together with the set of furnaces 4 is rotationally mounted in base 10 and is secured in a desired angular position by means of a pin interlock 11. In the autoclave 1, placed in the set of furnaces 4, the convective flow of supercritical solution takes place as determined by the installation 2. The installation 2 is in the form of a horizontal baffle 12 having a central opening. The baffle 12 separates the dissolution zone 13 from the crystallization zone 14 in the autoclave 1, and enables, together with the adjustable tilting angle of the autoclave 1, controlling of speed and type of convective flow. The temperature level of the individual zones in the autoclave 1 is controlled by means of a control system 15 operating the furnaces 4. In the autoclave 1, the dissolution zone 13 coincides with the low-temperature zone of the set of furnaces 4, is located above the horizontal baffle 12 and the feedstock 16 is put into this zone 13. On the other hand, the crystallization zone 14 coincides with the high-temperature zone of the set of furnaces 4 and it is located below the horizontal baffle 12. The seed 17 is mounted in this zone 14. The mounting location of the seed 17 is below the intersection of the rising and descending convective streams.

Figure 5:
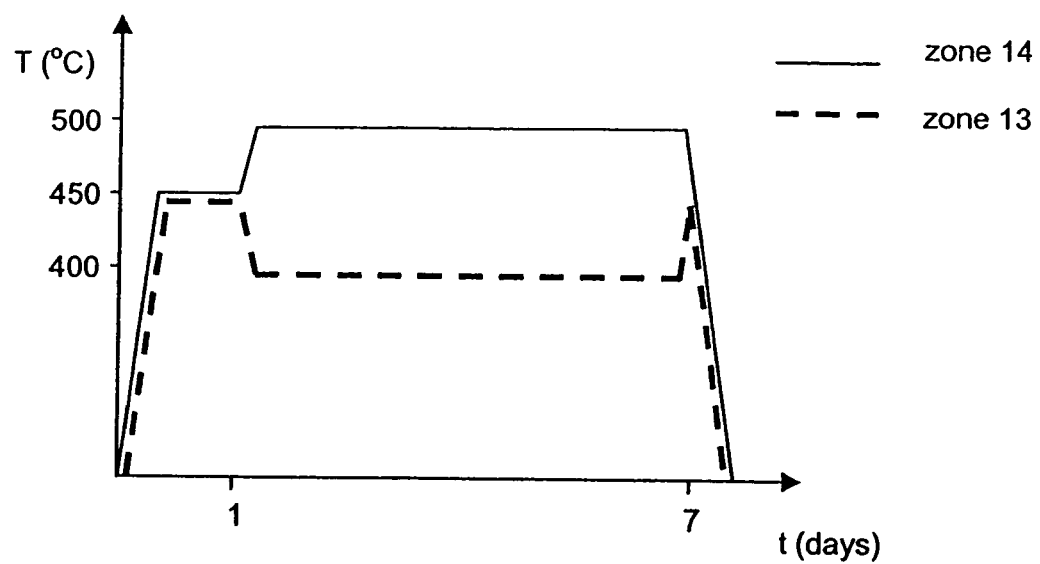
FIG. 5 shows the diagram of time variations of temperature in an autoclave for Example 4.

An amount of 3.0 g of gallium nitride produced by the HVPE method was placed in the high-pressure autoclave described above, which was set in the horizontal position. This gallium nitride had the form of plates of about 0.2 mm thickness, and it was distributed (roughly uniformly) in equal portions in the dissolution zone 13 and the crystallization zone 14. The portion placed in the dissolution zone 13 played the role of feedstock, whereas the portion placed in the crystallization zone 14 played the role of crystallization seeds. Metallic potassium of 4N purity was also added in a quantity of 2.4 g. Then the autoclave 1 was filled with 15.9 g of ammonia (5N), closed, put into a set of furnaces 4 and heated to a temperature of 450° C. The pressure inside the autoclave 1 was approx. 2 kbar. During this stage, which lasted one day, a partial dissolution of gallium nitride was carried out in both zones. Then the temperature of the crystallization zone 14 was increased to 500° C. while the temperature of the dissolution zone 13 was lowered to 400° C. and the autoclave 1 was kept in these conditions for 6 more days (FIG. 5). As a final result of this process, partial dissolution of the feedstock in the dissolution zone 13 and crystallization of gallium nitride on the gallium nitride seeds in the crystallization zone 14 took place.

Example 5

Figure 6:
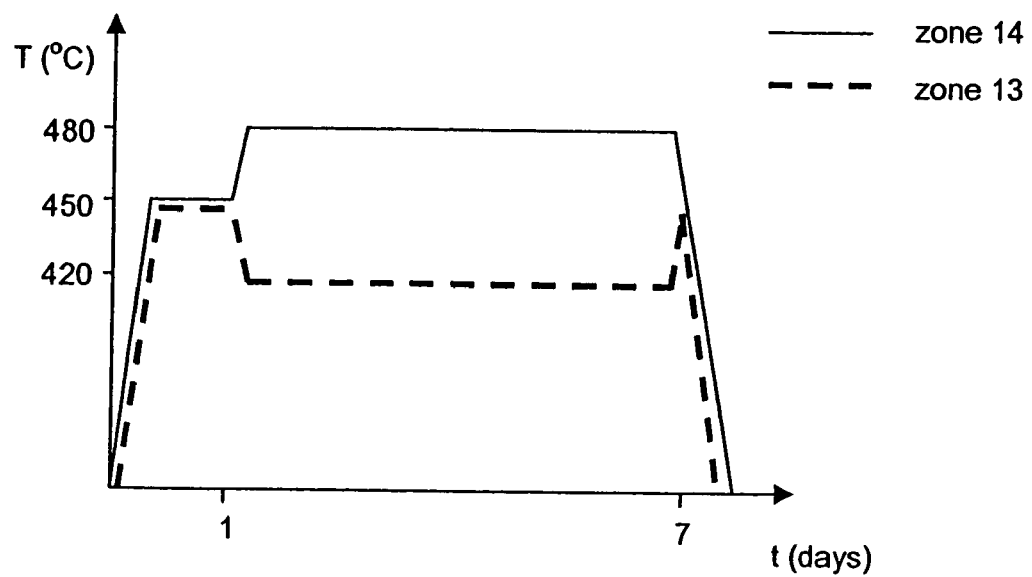
FIG. 6 shows the diagram of time variations of temperature in an autoclave for Example 5.

The above-mentioned high pressure autoclave 1 having a volume of 35.6 cm$^3$ was charged with feedstock in the form of a 3.0 g pellet of sintered gallium nitride (introduced into the dissolution zone 13) two seeds of gallium nitride obtained by the HVPE method and having the form of plates having a thickness of 0.4 mm and total weight of 0.1 g (introduced into the crystallization zone 14), as well as with 2.4 g of metallic potassium of 4N purity. Then the autoclave was filled with 15.9 g of ammonia (5N) and closed. The autoclave 1 was then put into a set of furnaces 4 and heated to 450° C. The pressure inside the autoclave was about 2 kbar. After an entire day the temperature of the crystallization zone 14 was raised to 480° C., while the temperature of dissolution zone 13 was lowered to 420° C. and the autoclave was maintained under these conditions for 6 more days (see FIG. 6). As a result of the process the feedstock was partially dissolved in the dissolution zone 13 and gallium nitride crystallized on the seeds in the crystallization zone 14. The two-sided monocrystalline layers had total thickness of about 0.2 mm.

Example 6

Figure 7:
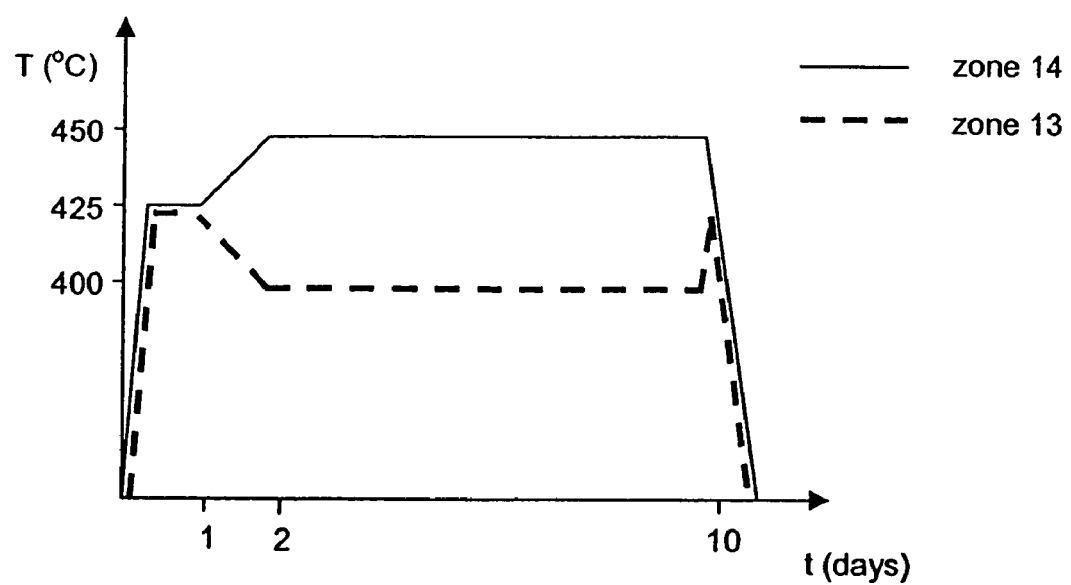
FIG. 7 shows the diagram of time variations of temperature in an autoclave for Example 6.

The above-mentioned high pressure autoclave 1 having a volume of 35.6 cm$^3$ (see FIG. 9) was charged with 1.6 g of feedstock in the form of gallium nitride produced by the HVPE method and having the form of plates having a thickness of about 0.2 mm (introduced into the dissolution zone 13), three gallium-nitride seeds of a thickness of about 0.35 mm and a total weight of 0.8 g, also obtained by the HVPE method (introduced into the crystallization zone 14), as well as with 3.56 g of metallic potassium of 4N purity. The autoclave 1 was filled with 14.5 g of ammonia (5N) and closed. Then the autoclave 1 was put into a set of furnaces 4 and heated to 425° C. The pressure inside the autoclave was approx. 1.5 kbar. After an entire day the temperature of dissolution zone 13 was lowered to 400° C. while the temperature of crystallization zone 14 was increased to 450° C. and the autoclave was kept in these conditions for 8 more days (see FIG. 7). After the process, the feedstock was found to be partially dissolved in the dissolution zone 13 and gallium nitride had crystallized on the seeds of the HVPE GaN in the crystallization zone 14. The two-sided monocrystalline layers had a total thickness of about 0.15 mm.

Example 7

Figure 8:
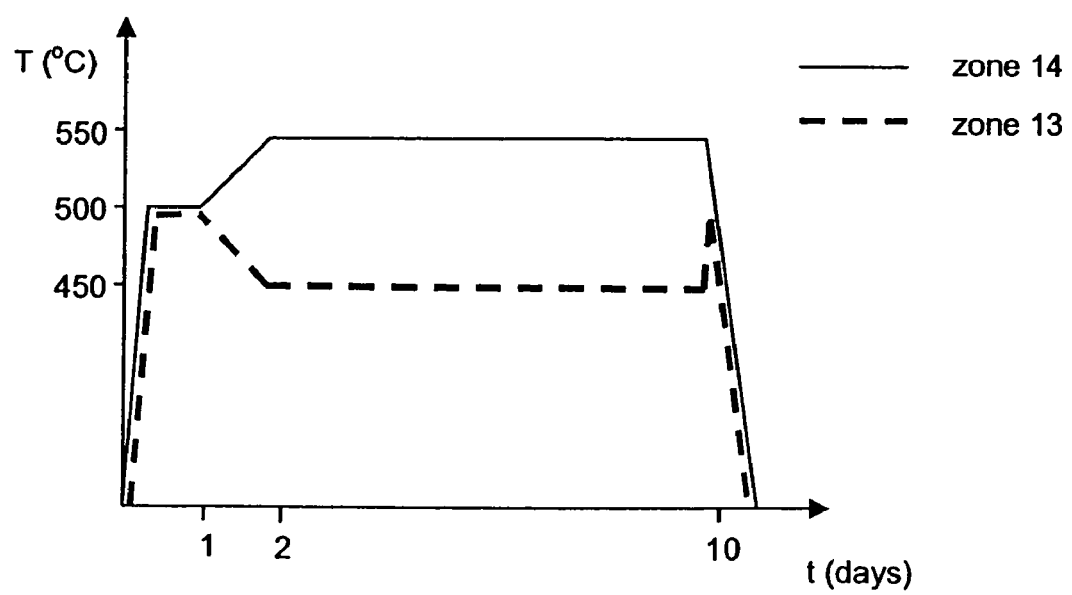
FIG. 8 shows the diagram of time variations of temperature in an autoclave for Example 7.

The above-mentioned high pressure autoclave 1 having a volume of 35.6 cm$^3$ (see FIG. 9) was charged in its dissolution zone 13 with 2 g of feedstock in the form of gallium nitride produced by the HVPE method and having the form of plates having a thickness of about 0.2 mm, and 0.47 g of metallic potassium of 4N purity, and in its crystallization zone 14 with three GaN seeds of a thickness of about 0.3 mm and a total weight of about 0.3 g also obtained by the HVPE method. The autoclave was filled with 16.5 g of ammonia (5N) and closed. Then the autoclave 1 was put into a set of furnaces 4 and heated to 500° C. The pressure inside the autoclave was approx. 3 kbar. After an entire day the temperature in the dissolution zone 13 was reduced to 450° C. while the temperature in the crystallization zone 14 was raised to 550° C. and the autoclave was kept under these conditions for the next 8 days (see FIG. 8). After the process, the feedstock was found to be partially dissolved in the dissolution zone 13 and gallium nitride had crystallized on seeds in the crystallization zone 14. The two-sided monocrystalline layers had a total thickness of about 0.4 mm.

Example 8

Figure 11:
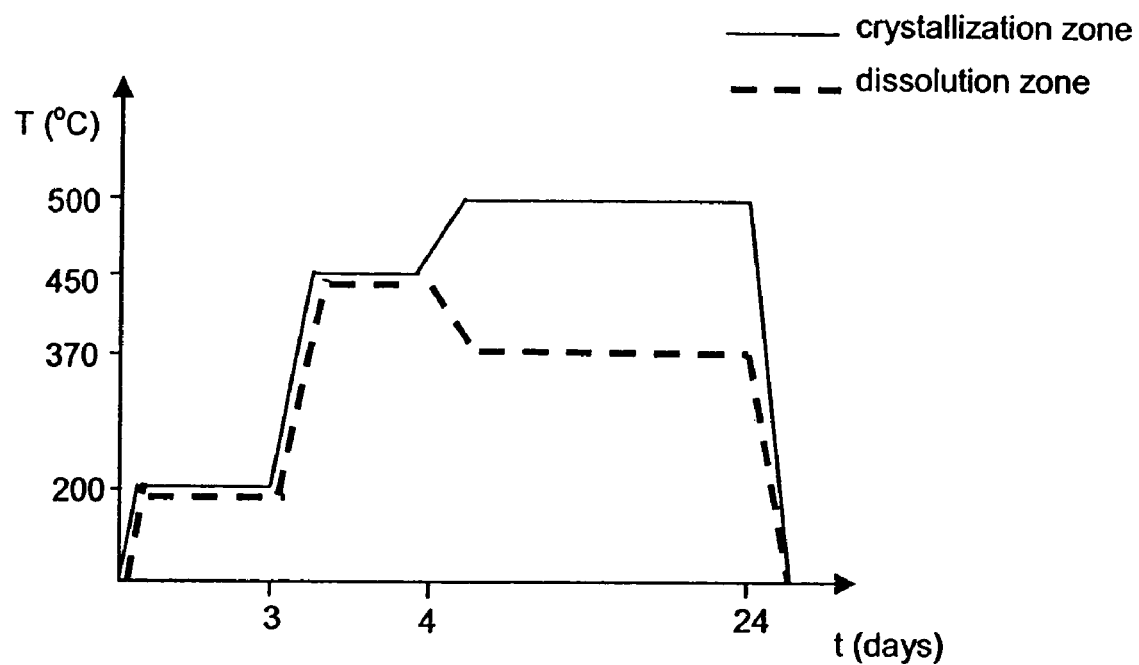
FIG. 11 shows the diagram of time variations of temperature in an autoclave at constant volume for Example 8.

An amount of 1.0 g of gallium nitride produced by the HVPE method was put into the dissolution zone 13 of the high-pressure autoclave 1 having a volume of 35.6 cm$^3$. In the crystallization zone 14 of the autoclave, a seed crystal of gallium nitride having a thickness of 100 μm and a surface area of 2.5 cm$^2$, obtained by the HVPE method, was placed. Then the autoclave was charged with 1.2 g of metallic gallium of 6N purity and 2.2 g of metallic potassium of 4N purity. Subsequently, the autoclave 1 was filled with 15.9 g of ammonia (5N), closed, put into a set of furnaces 4 and heated to a temperature of 200° C. After 3 days—during which period metallic gallium was dissolved in the supercritical solution. The temperature was increased to 450° C. which resulted in a pressure of about 2.3 kbar. The next day, the crystallization zone temperature was increased to 500° C. while the temperature of the dissolution zone 13 was lowered to 370° C. and the autoclave 1 was kept in these conditions for the next 20 days (see FIG. 11). As a result of this process, the partial dissolution of the material in the dissolution zone 13 and the growth of the gallium nitride on gallium nitride seeds in the crystallization zone 14 took place. The resulting crystal of gallium nitride having a total thickness of 350 μm was obtained in the form of two-sided monocrystalline layers.

Example 9

Figure 12:
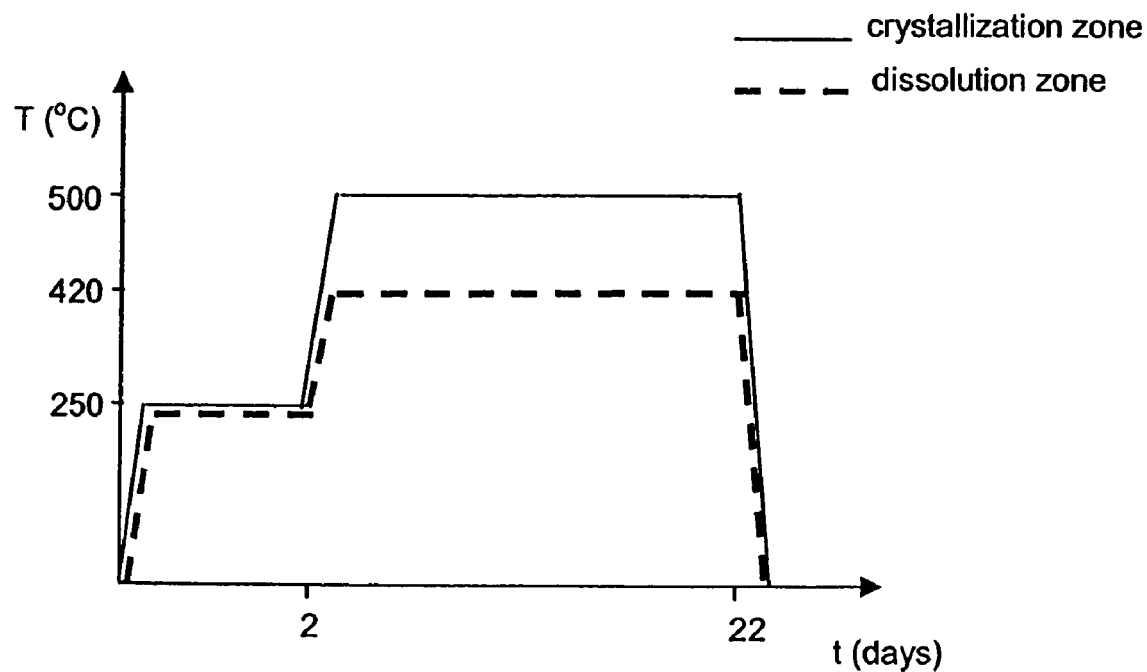
FIG. 12 shows the diagram of time variations of temperature in an autoclave at constant volume for Example 9.

An amount of 3.0 g of gallium nitride in the form of a sintered gallium nitride pellet was put into the dissolution zone 13 of high-pressure autoclave 1 having a volume of 35.6 cm$^3$ (see FIG. 9). In the crystallization zone 14 of the autoclave, a seed crystal of gallium nitride obtained by the HVPE method and having a thickness of 120 μm and a surface area of 2.2 cm$^2$ was placed. Then the autoclave was charged with 2.3 g of metallic potassium of 4N purity. Subsequently, the autoclave 1 was filled with 15.9 g of ammonia (5N), closed, put into a set of furnaces 4 and heated to a temperature of 250° C. in order to partially dissolve the sintered GaN pellet and obtain a preliminary saturation of a supercritical solution with gallium in the soluble form. After two days, the crystallization zone 14 temperature was increased to 500° C. while the temperature of the dissolution zone 13 was lowered to 420° C. and the autoclave 1 was kept in these conditions for the next 20 days (see FIG. 12). As a result of this process, partial dissolution of the material in the dissolution zone 13 and the growth of gallium nitride on the gallium nitride seed took place in the crystallization zone 14. A crystal of gallium nitride having a total thickness of 500 μm was obtained in the form of two-sided monocrystalline layers.

Example 10

Figure 13:
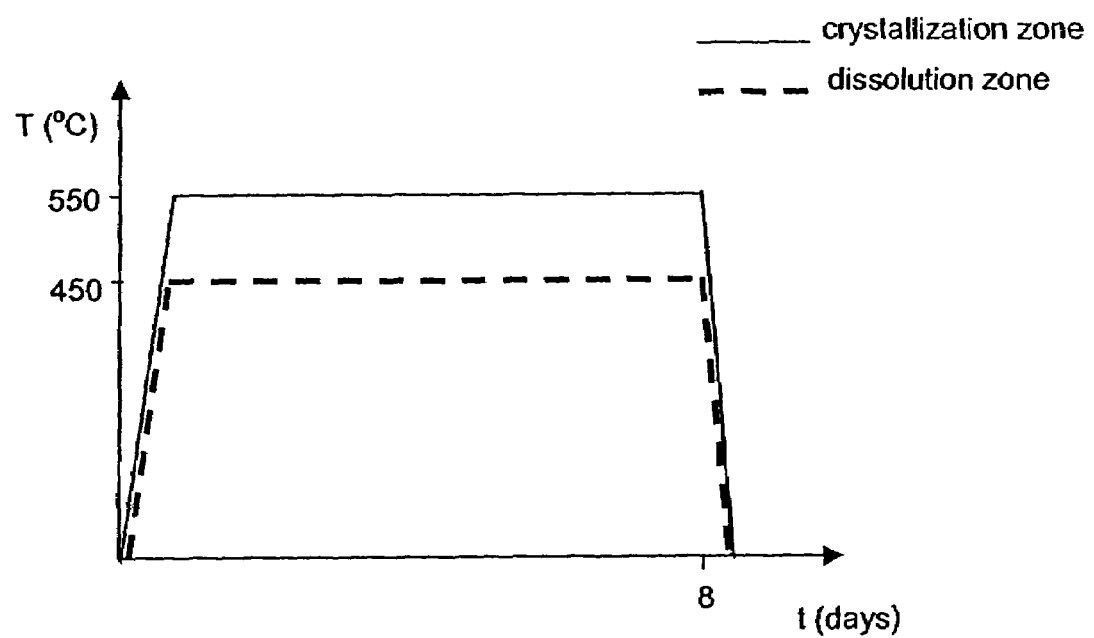
FIG. 13 shows the diagram of time variations of temperature in an autoclave at constant volume for Example 10.

An amount of 0.5 g of gallium nitride plates having an average thickness of about 120 μm, produced by the HVPE method, were put into the dissolution zone 13 of high-pressure autoclave 1 having a volume of 35.6 cm$^3$. In the crystallization zone 14 of the autoclave, three seed crystals of gallium nitride obtained by the HVPE method were placed. The seed crystals had a thickness of about 120 μm and a total surface area of 1.5 cm$^2$. Then the autoclave was charged with 0.41 g of metallic lithium of 3N purity. Subsequently, the autoclave 1 was filled with 14.4 g of ammonia (5N), closed, put into a set of furnaces 4 and heated so that the temperature of the crystallization zone 14 was increased to 550° C. and the temperature of the dissolution zone 13 was increased to 450° C. The resulting pressure was about 2.6 kbar. The autoclave 1 was kept in these conditions for the next 8 days (see FIG. 13). As a result of this process, partial dissolution of the material in the dissolution zone 13 and growth of gallium nitride on the gallium nitride seeds in the crystallization zone 14 took place. The resulting crystals of gallium nitride had a thickness of 40 μm and were in the form of two-sided monocrystalline layers.

Example 11

Figure 14:
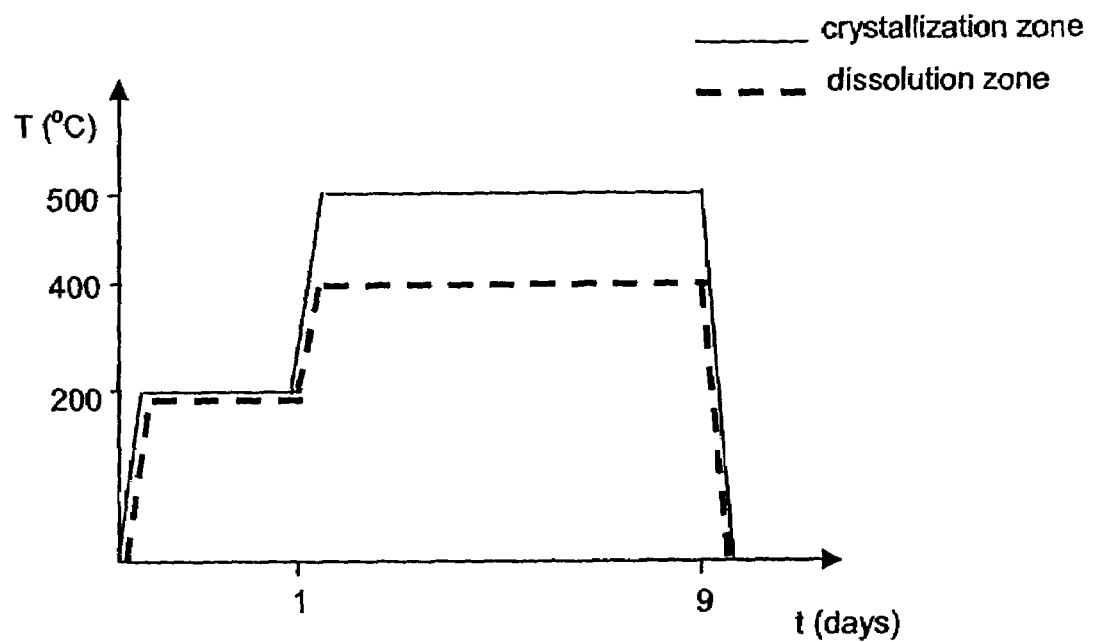
FIG. 14 shows the diagram of time variations of temperature in an autoclave at constant volume for Examples 11 and 12.

An amount of 0.5 g of gallium nitride having an average thickness of about 120 μm, produced by the HVPE method, was placed into the dissolution zone 13 of high-pressure autoclave 1 having a volume of 35.6 cm$^3$. In the crystallization zone 14 of the autoclave, three seed crystals of gallium nitride obtained by the HVPE method were placed. The seed crystals had a thickness of 120 μm and a total surface area of 1.5 cm$^2$. Then the autoclave was charged with 0.071 g of metallic gallium of 6N purity and 1.4 g of metallic sodium of 3N purity. Subsequently, the autoclave 1 was filled with 14.5 g of ammonia (5N), closed, put into a set of furnaces 4 and heated to temperature of 200° C. After 1 day—during which period metallic gallium was dissolved in the supercritical solution—the autoclave 1 was heated so that the temperature in the crystallization zone was increased to 500° C., while the temperature in the dissolution zone was increased to 400° C. The resulting pressure was about 2.3 kbar. The autoclave 1 was kept in these conditions for the next 8 days (see FIG. 14). As a result of this process, partial dissolution of the material in the dissolution zone 13 and growth of gallium nitride on gallium nitride seeds in the crystallization zone 14 took place. The resulting crystals of gallium nitride were obtained in the form of two-sided monocrystalline layers having a total thickness of 400 μm.

Example 12

An amount of 0.5 g of gallium nitride having an average thickness of about 120 μm, produced by the HVPE method, was placed into the dissolution zone 13 of the high-pressure autoclave 1 having a volume of 35.6 cm³. In the crystallization zone 14 of the autoclave, three seed crystals of gallium nitride obtained by the HVPE method were placed. The seed crystals had a thickness of 120 μm and a total surface area of 1.5 cm². Then the autoclave was charged with 0.20 g of gallium amide and 1.4 g of metallic sodium of 3N purity. Subsequently, the autoclave 1 was filled with 14.6 g of ammonia (5N), closed, put into a set of furnaces 4 and heated to a temperature of 200° C. After 1 day—during which period gallium amide was dissolved in the supercritical solution— the autoclave 1 was heated so that the temperature in the crystallization zone was increased to 500° C., while the temperature in the dissolution zone was increased to 400° C. The resulting pressure was about 2.3 kbar. The autoclave 1 was kept in these conditions for the next 8 days (see also FIG. 14). As a result of this process, partial dissolution of the material in the dissolution zone 13 and growth of gallium nitride on gallium nitride seeds in the crystallization zone 14 took place. The resulting crystals of gallium nitride were in the form of two-sided monocrystalline layers having a total thickness of 490 μm.

Example 13

One crucible was placed into the above-mentioned high-pressure autoclave having a volume of 10.9 cm³. The crucible contained 0.3 g of the feedstock in the form of metallic gallium of 6N purity. Also three gallium-nitride seeds having a thickness of about 0.5 mm and a total mass of 0.2 g, all obtained by the HVPE method, were suspended within the reaction chamber. Further, 0.5 g of metallic sodium of 3N purity was placed in the autoclave; the autoclave was filled with 5.9 g of ammonia and then closed. The autoclave was put into a furnace and heated to a temperature of 200° C., where the pressure was about 2.5 kbar. After 1 day the temperature was increased to 500° C., while the pressure increased up to 5 kbar and the autoclave was maintained in these conditions for further 2 days. As a result of this process, the feedstock was completely dissolved and the crystallization of gallium nitride took place on the seed. The average thickness of the two-side-overgrown monocrystalline layer of gallium nitride was about 0.14 mm. The FWHM of the X-ray rocking curve from the (0002) plane at the gallium-terminated side was 43 arcsec, while at the nitrogen-terminated side it was 927 arcsec.

The monocrystalline layers have a wurzite structure like in all of the other examples.

What is claimed is:

1. An apparatus for recrystallizing a gallium-containing nitride crystal on a seed in a supercritical state of a nitrogen-containing solvent containing an alkali metal component, comprising:
    an autoclave having an internal space provided with a device which separates the internal space into two zones, wherein the device which separates the internal space comprises at least one baffle having at least one opening, the at least one opening in the at least one baffle includes at least one of a central opening and a circumferential opening for keeping the nitrogen-containing solvent convection between the two zones;
    a first heating device disposed on an outer surface of the autoclave in a position corresponding to an upper zone of the autoclave;
    a second heating device disposed on an outer surface of the autoclave in a position corresponding to a lower zone of the autoclave;
    a cooling device disposed on an outer surface of the autoclave in a position between said first heating device and said second heating device;
    at least one temperature control device for controlling said first heating device, said second heating device and said cooling device to make a temperature profile in the autoclave;
    wherein the upper zone of the autoclave, which has a feedstock for the gallium-containing nitride is provided as a dissolution zone, while the lower zone of the autoclave, which has at least one crystallization seed for the gallium-containing nitride is provided as crystallization zone,
    wherein said first heating device and said second heating device are separated so said first heating device and said second heating device are spaced apart from a position corresponding to the device which separates the internal space; and
    wherein the lower zone of the autoclave is controlled at a higher temperature than the upper zone of the autoclave by using the at least one temperature control device.

2. The apparatus according to claim 1, wherein the temperature control device has an ability to make the upper zone of the autoclave controlled at a lower temperature than that of the lower zone according to a negative temperature coefficient of a solubility of the gallium-containing nitride crystal in the supercritical state of the nitrogen-containing solvent containing the alkali metal component.

3. The apparatus according to claim 1, wherein the feedstock comprises metallic gallium and gallium nitride.

4. The apparatus according to claim 1, wherein the feedstock further comprises an aluminum feedstock, an indium feedstock or mixtures thereof, which are selected from the group consisting of metallic aluminum, metallic indium, their alloys, their nitrides, azides, imides, amidoimides, and hydrides.

5. The apparatus according to claim 1, wherein the nitrogencontaining solvent comprises NH3.

6. The apparatus according to claim 1, wherein the seed has a surface of a compound represented by the general formula $Al_xGa_{1-x-y}In_yN$, where $0<x<1$, $0<y<1$, and $0<x+y<1$.

7. The apparatus according to claim 1, wherein the cooling device is at least one of a liquid cooling device and a fan.

8. The apparatus according to claim 1, wherein the first heating device and the second heating device are electrically powered by at least one of an inductive heating means and a resistive heating means.

9. The apparatus according to claim 1, wherein the cooling device is at least one of a liquid cooling device and a fan.

10. The apparatus according to claim 1, wherein the circumferential opening is located between a wall of said autoclave and a portion of said baffle.

11. An apparatus for recrystallizing a gallium-containing nitride crystal on a seed in a supercritical state of a nitrogen-containing solvent containing an alkali metal component, comprising:
    an autoclave having an internal space provided with a device which separates the internal space into two zones, wherein the device which separates the internal space comprises at least one baffle having at least one opening, the at least one opening in the at least one baffle includes at least one of a central opening and a circumferential opening for keeping the nitrogen containing solvent convection between the two zones;

a first heating device disposed on an outer surface of the autoclave in a position corresponding to an upper zone of the autoclave;

a second heating device disposed on an outer surface of the autoclave in a position corresponding to a lower zone of the autoclave;

a cooling device disposed on an outer surface of the autoclave in a position between said first heating device and said second heating device;

at least one of temperature control device for controlling said first heating device, said second heating device and said cooling device to make a temperature profile in the autoclave;

wherein the upper zone of the autoclave is provided as a dissolution zone where feedstock for the gallium-containing nitride is placed, while the lower zone of the autoclave is provided as crystallization zone where at least one crystallization seed for the gallium-containing nitride is placed; and wherein the lower zone of the autoclave is controlled at a higher temperature than the upper zone of the autoclave by using the heating device and the cooling device;

wherein the temperature control device has an ability to make the upper zone of the autoclave controlled at a lower temperature than that of the lower zone according to a negative temperature coefficient of a solubility of the gallium-containing nitride crystal in the supercritical state of the nitrogen-containing solvent containing the alkali metal component.

12. The apparatus according to claim 11, wherein the heating device is electrically powered by at least one of an inductive heating means and a resistive heating means.

13. The apparatus according to claim 11, wherein the cooling device is at least one of a liquid cooling device and a fan.

14. An apparatus for recrystallizing a gallium-containing nitride crystal on a seed in a supercritical state of a nitrogen-containing solvent containing an alkali metal component, comprising:

an autoclave having an internal space provided with a device which separates the internal space into two zones, wherein the device which separates the internal space comprises at least one baffle having an opening for keeping the nitrogen-containing solvent convection between the two zones;

a first heating device disposed on an outer surface of the autoclave in a position corresponding to an upper zone of the autoclave;

a second heating device disposed on an outer surface of the autoclave in a position corresponding to a lower zone of the autoclave;

a cooling device disposed on an outer surface of the autoclave in a position between said first heating device and said second heating device;

at least one temperature control device for controlling said first heating device, said second heating device and said cooling device to make a temperature profile in the autoclave;

wherein the upper zone of the autoclave is provided as a dissolution zone where feedstock for the gallium-containing nitride is placed, while the lower zone of the autoclave is provided as crystallization zone where at least one crystallization seed for the gallium-containing nitride is placed.

* * * * *